United States Patent [19]

Itoh et al.

[11] Patent Number: 4,800,530

[45] Date of Patent: Jan. 24, 1989

[54] SEMICONDUCTOR MEMORY SYSTEM WITH DYNAMIC RANDOM ACCESS MEMORY CELLS

[75] Inventors: Yasuo Itoh; Fumio Horiguchi, both of Kawasaki; Shigeyoshi Watanabe, Yokohama; Kazunori Ohuchi, Yokohama; Mitsugi Ogura, Yokohama, all of Japan

[73] Assignee: Kabushiki Kasiha Toshiba, Kawasaki, Japan

[21] Appl. No.: 85,086

[22] Filed: Aug. 13, 1987

[30] Foreign Application Priority Data

Aug. 19, 1986 [JP] Japan .................................. 61-193509
Aug. 20, 1986 [JP] Japan .................................. 61-194573
Sep. 3, 1986 [JP] Japan .................................. 61-207192

[51] Int. Cl.$^4$ ........................ G11C 7/00; G11C 11/40
[52] U.S. Cl. .................................... 365/189; 365/230; 365/233
[58] Field of Search ................. 365/189, 230, 233, 77, 365/78

[56] References Cited

U.S. PATENT DOCUMENTS

| | | | |
|---|---|---|---|
| 4,638,458 | 1/1987 | Itoh | 365/51 |
| 4,648,077 | 3/1987 | Pinkham et al. | 365/189 X |
| 4,688,197 | 8/1987 | Novak et al. | 365/230 |
| 4,723,226 | 2/1988 | McDonough et al. | 365/230 X |
| 4,725,987 | 2/1988 | Cates | 365/189 X |

FOREIGN PATENT DOCUMENTS 57-27477  2/1982  Japan .
61-18837  5/1986  Japan .

Primary Examiner—Stuart N. Hecker
Assistant Examiner—Alyssa H. Bowler
Attorney, Agent, or Firm—Oblon, Fisher, Spivak, McClelland & Maier

[57] ABSTRACT

A dynamic random access memory system comprises first and second memory banks. A plurality of memory cells connected to a word line are grouped into first and second groups. The first group is arranged in the first memory bank and the second group is arranged in the second memory bank. Read/write means is provided in which each n bits from and to the first group and each n bits from and to the second group are read and written alternatively. Each bit is read and written in synchronism with the toggles of a column address strobe signal.

11 Claims, 31 Drawing Sheets

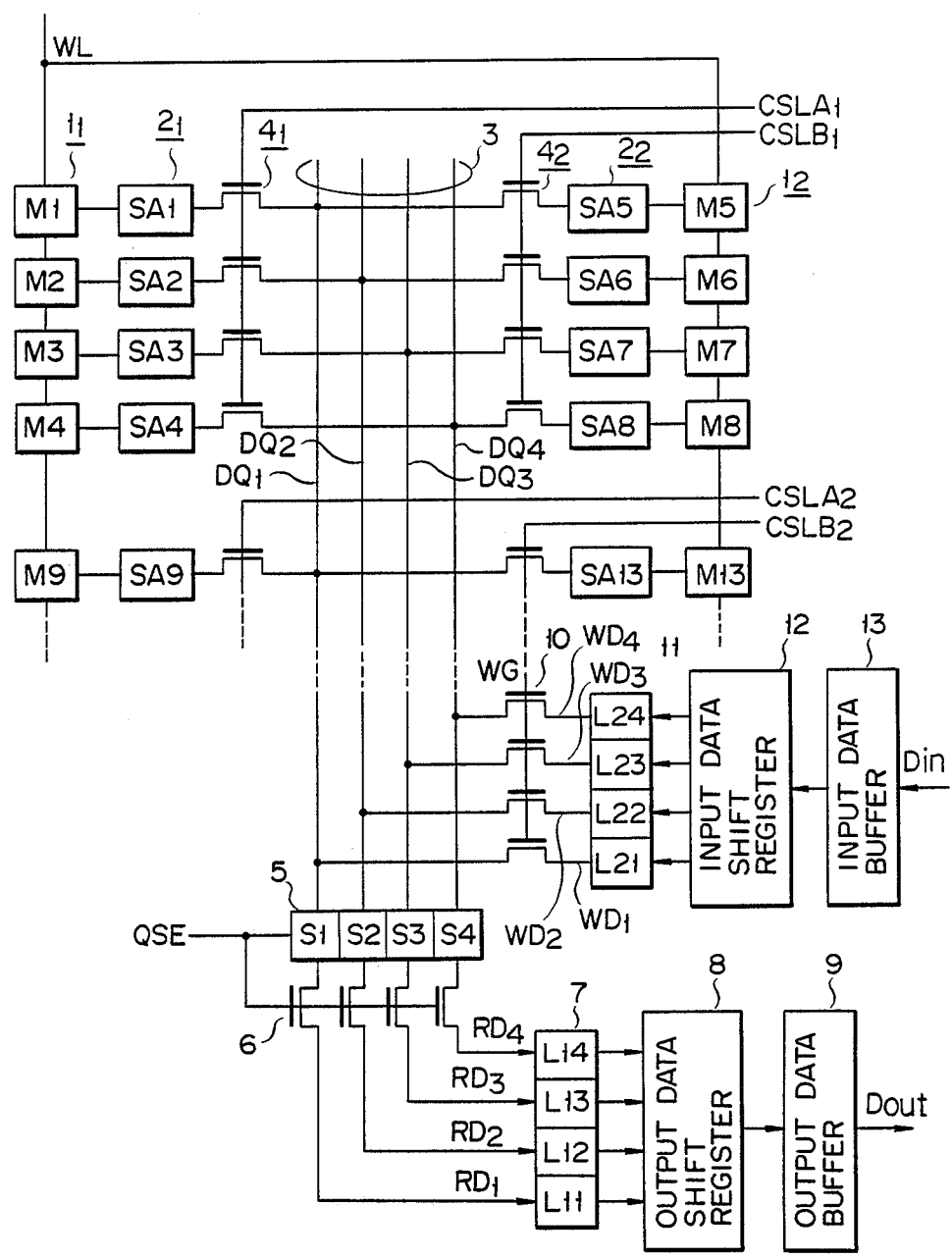
F I G. 9

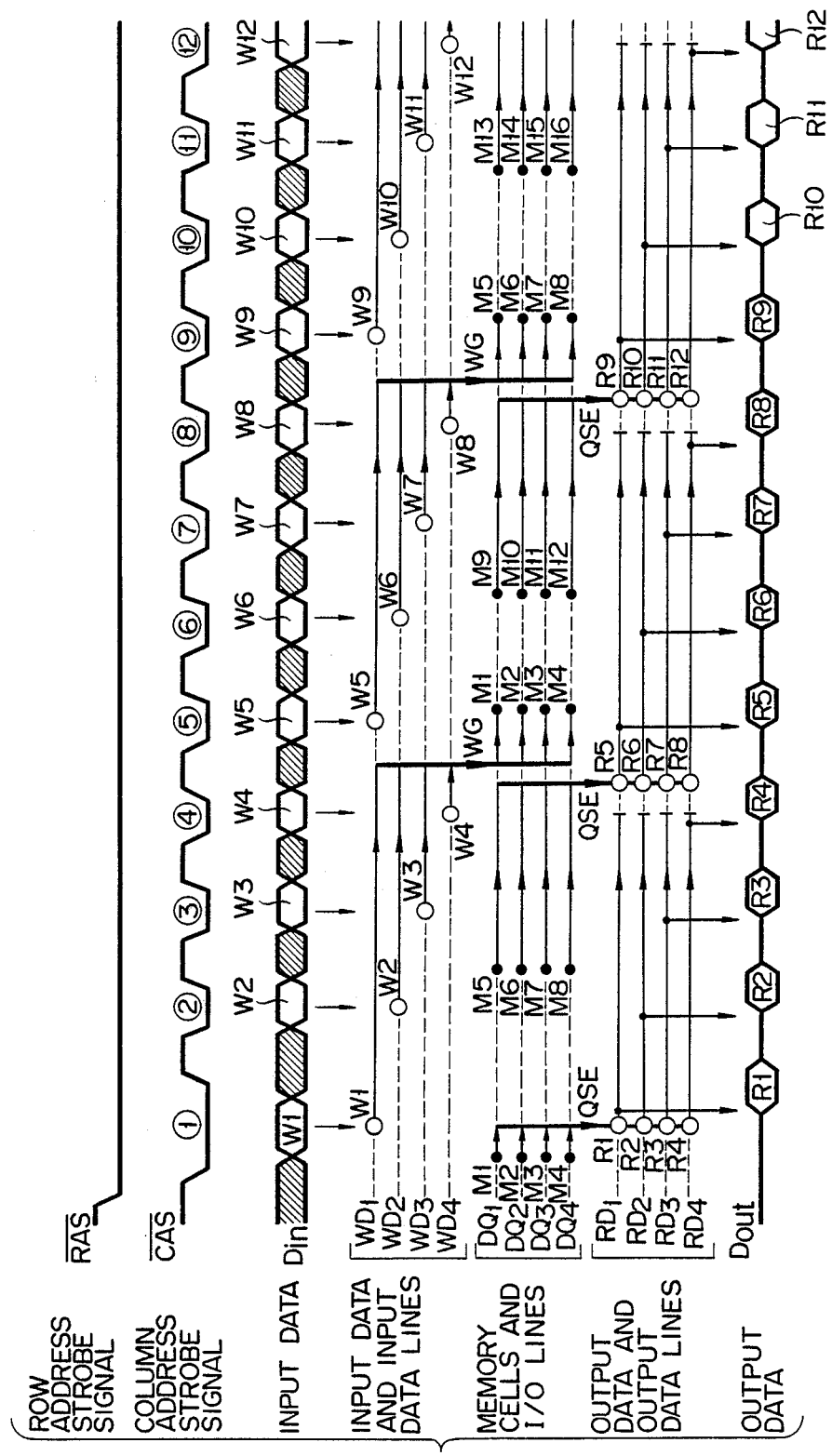
F I G. 10

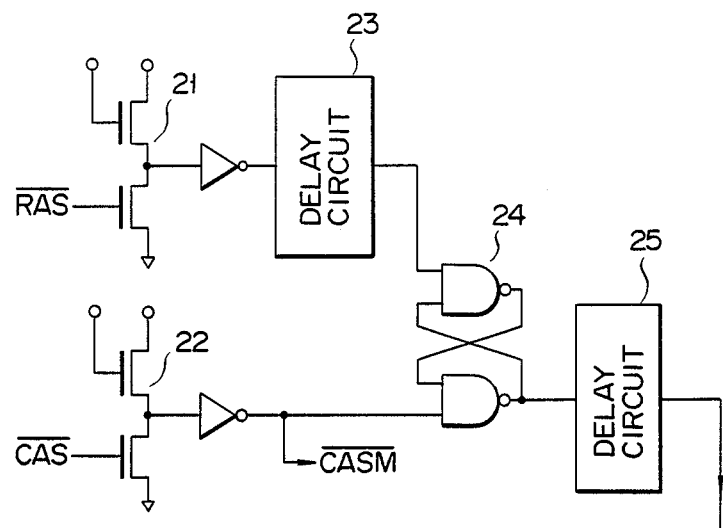
F I G. 11A
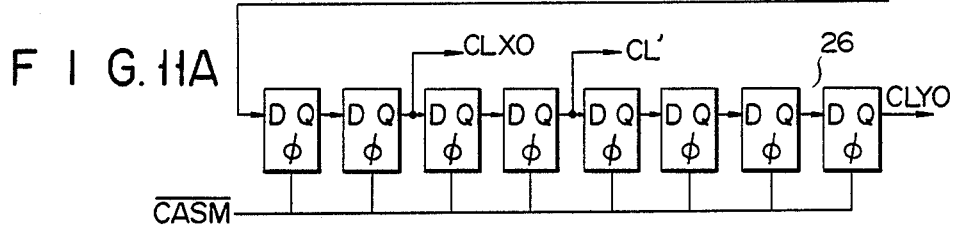
F I G. 11B
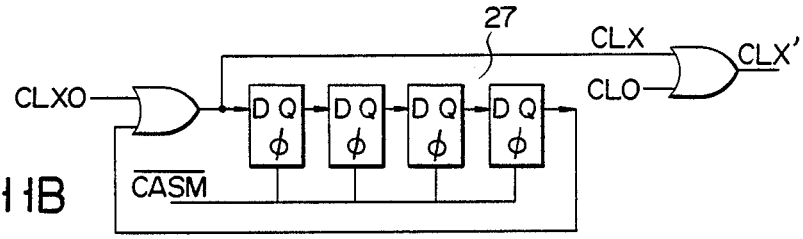
F I G. 11C
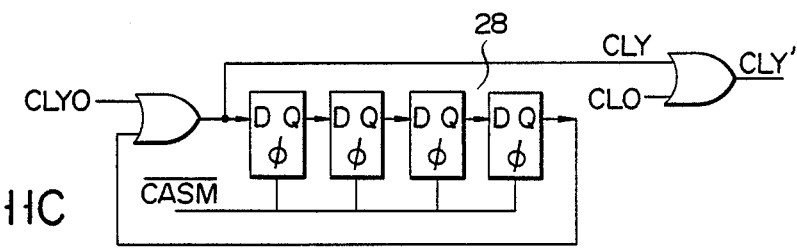

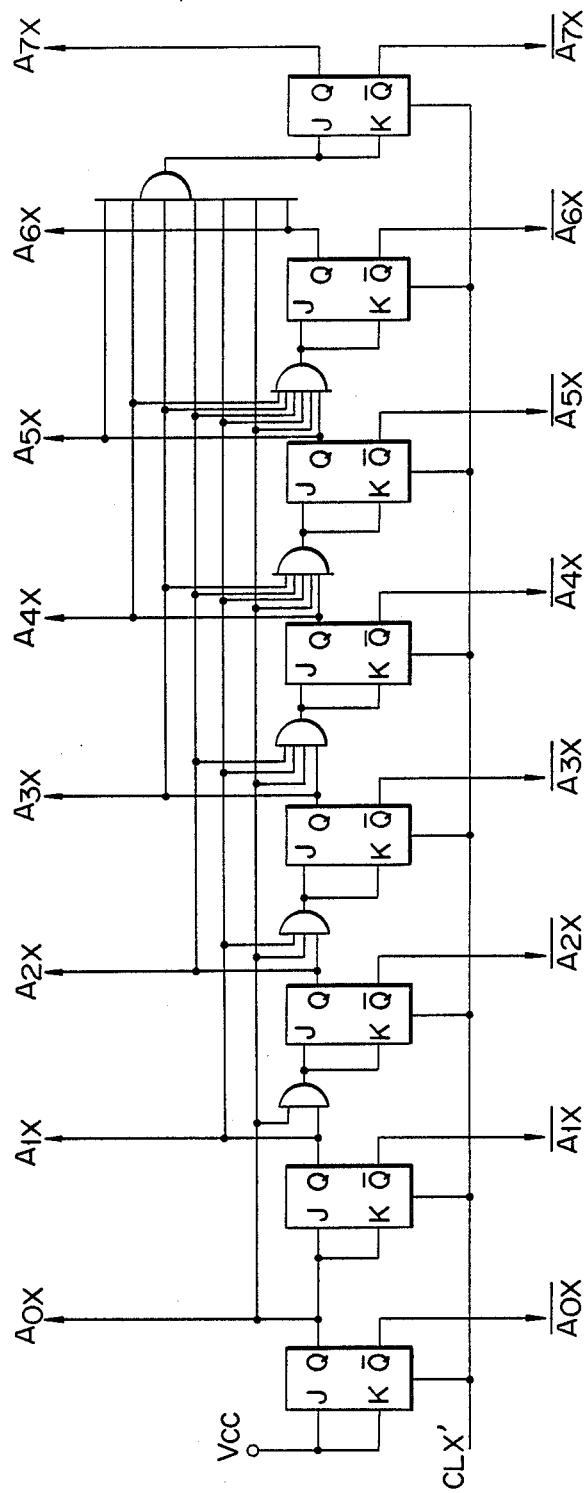
F I G. 12

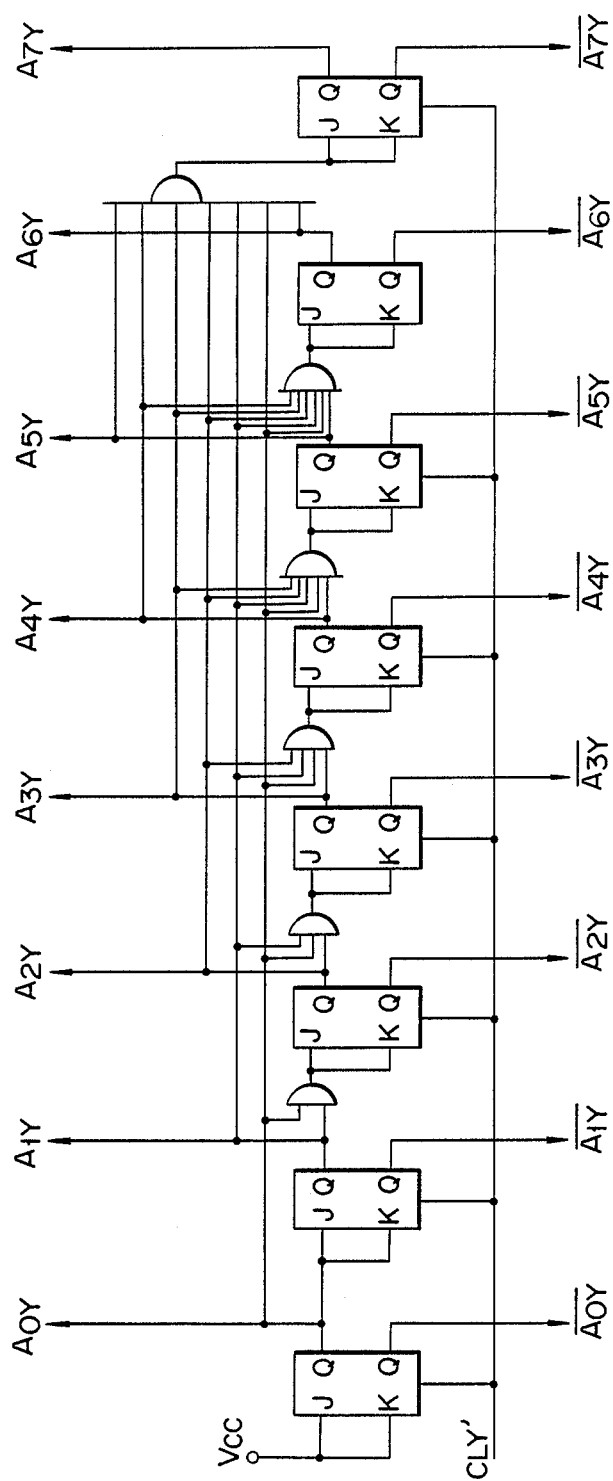
F I G. 13

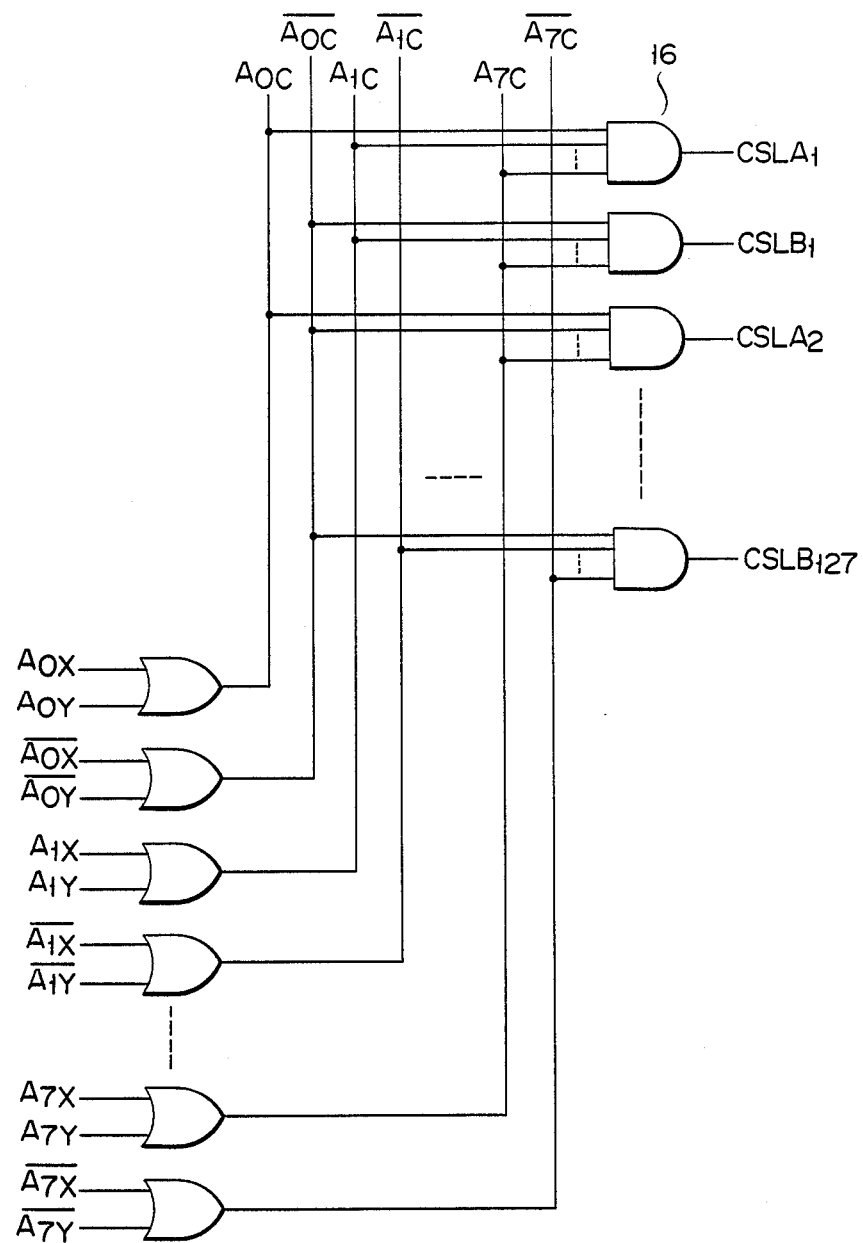
F I G. 14

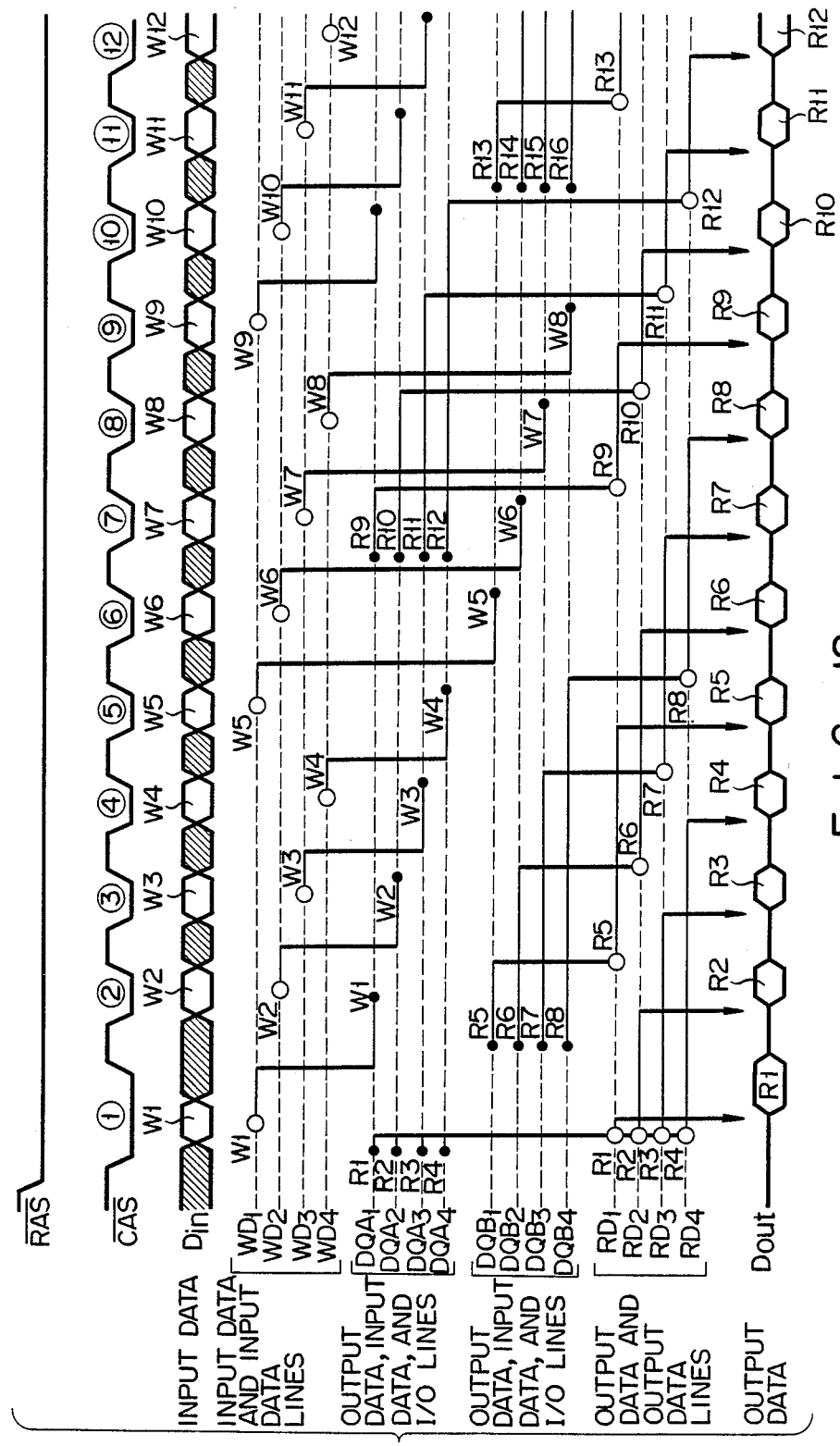
F I G. 18

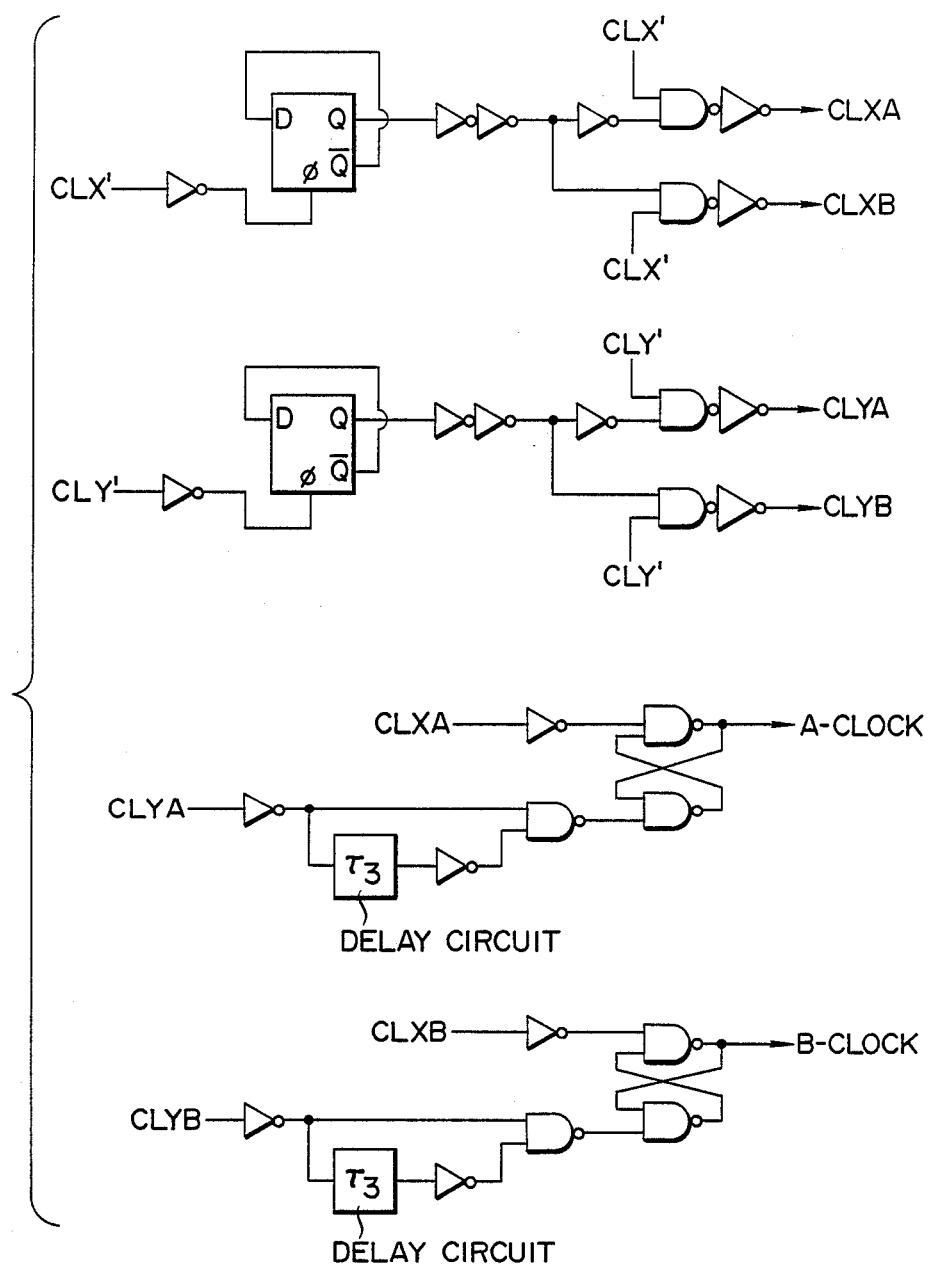
F I G. 19

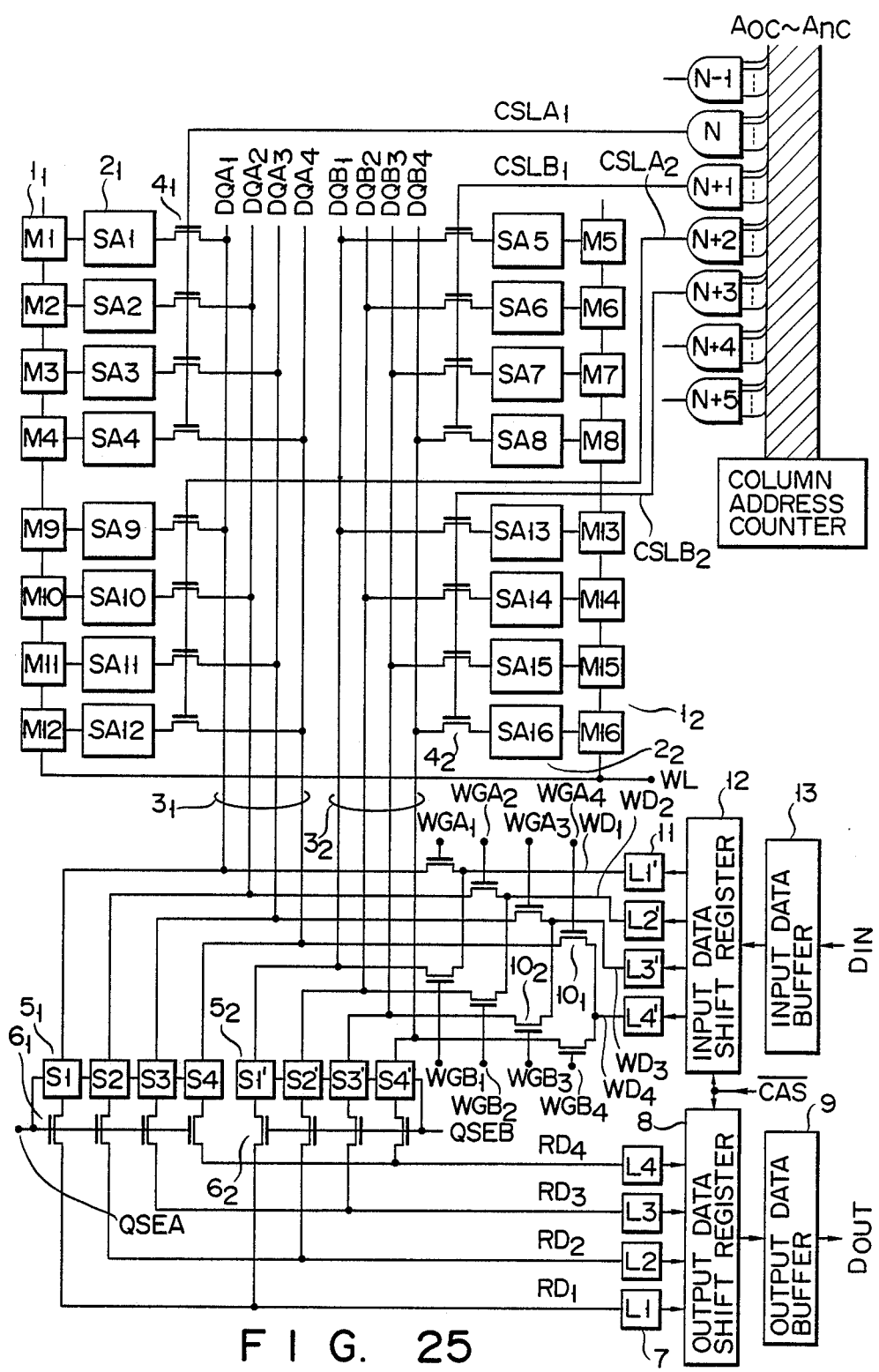
F I G. 25

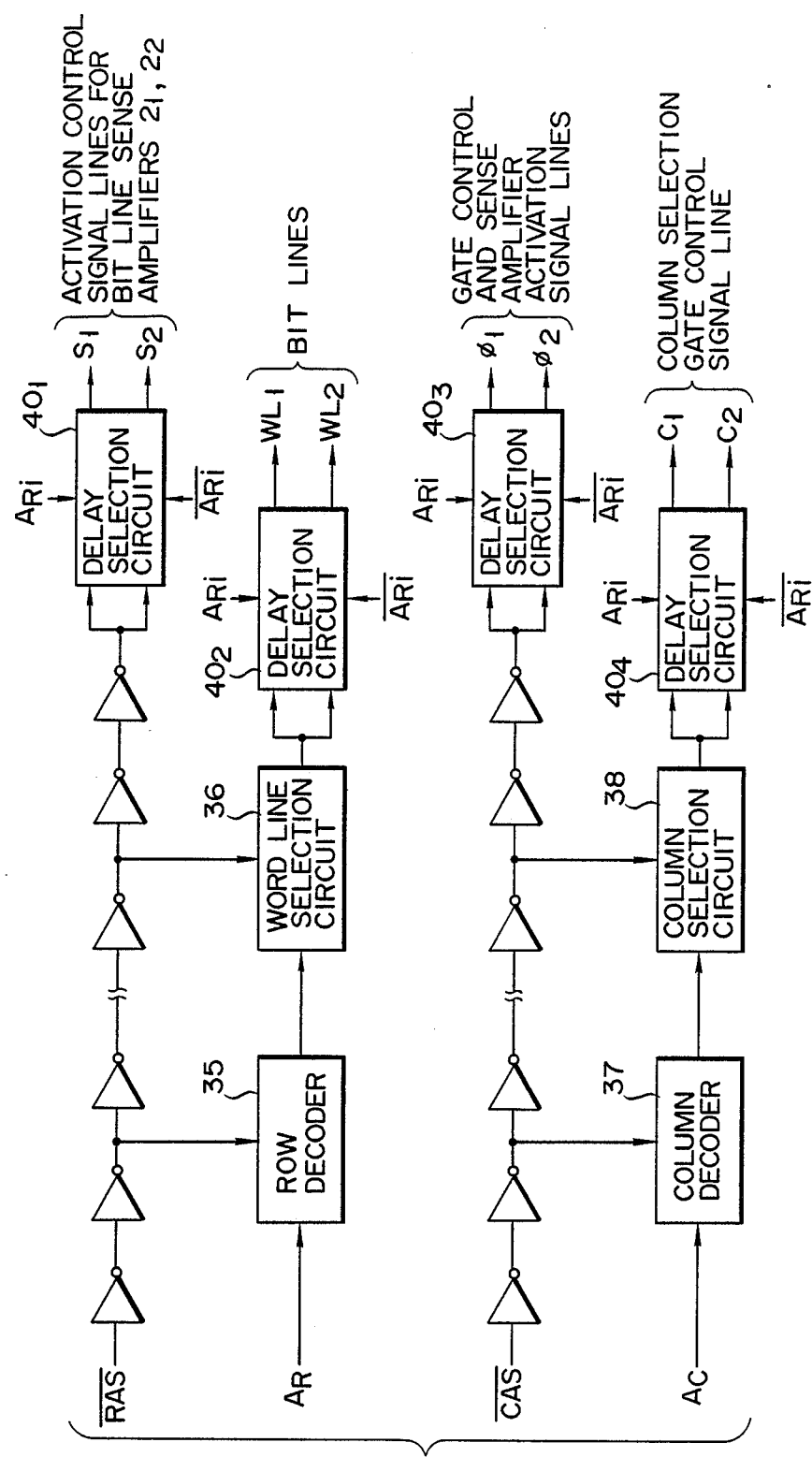
F I G. 31

SEMICONDUCTOR MEMORY SYSTEM WITH DYNAMIC RANDOM ACCESS MEMORY CELLS

BACKGROUND OF THE INVENTION

This invention relates to a semiconductor memory system, and more particularly to a semiconductor memory system which allows a dynamic random access.

Of MOS type semiconductor memories, the dRAM (dynamic random access memory) has increased its capacity at the rate of 400% every 3 years. A dRAM with the capacity of 1M bits has already been put to practical use. At the ISSCC (International Solid State Circuit Conference) held in 1986, several dRAMs having the capacity of 4M bits were presented.

With the increase of the memory capacity of the dRAM, great improvements have been made in the functions of the memory system, for example, use of a multi-bit system for the input/output and diversification of the operation modes. Particularly, in the page mode, nibble mode and static column mode, a high speed read/write operation is possible for a plurality of memory cells connected to a selected word line. Therefore, in these modes, the dRAM system can make a high speed access as fast as the static RAM system. In such high-speed operation modes, the performance of a computer can be improved, since the data can be input or output serially. If such a memory system is applied to an image memory, the picture quality can be improved.

In a computer system, to improve the data transfer speed between a main memory unit and a central processing unit (CPU), a cache memory is frequently located between these units and the data transfer is performed every fixed length data block. Also, to increase the throughput of the memory, the memory card groups constituting the main memory are arranged into memory banks. The addresses are successively allotted to these memory banks. The data in these memory banks are processed in parallel (the interleaving system). In this way, the mean memory cycle time is reduced. At present, the nibble mode is often used as an operation mode for realizing the reduction of the cycle time. In the nibble mode, a row address strobe signal (referred to as an $\overline{RAS}$ clock) is pulsed from "1" (H) level to "0" (L) level, so that the memory cells are activated. Then, the column address strobe signal (referred to as a $\overline{CAS}$ clock) is pulsed from "H" to "L", and one memory cell is selected. Subsequently, the $\overline{CAS}$ clock is reset and rendered "L" again while the $\overline{RAS}$ clock is kept at "L". This cyclic operation in which the $\overline{CAS}$ clock is reset and rendered "L" again is called a toggle of the $\overline{CAS}$ clock. This cyclic operation is repeated, so that column addresses are successively accessed without any supply of the column address signals from outside.

The operation of the prior art in the nibble mode will be described, referring to FIGS. 1 and 2. When the $\overline{RAS}$ clock is pulsed from "H" to "L", a train of activate signals are generated. First, row address signals are supplied to ten row address buffers (ten buffers for in a 1M bit dRAM and eleven for a 4M bit dRAM). A row address binary code in a MOS level is produced by each of the row address buffers. The row address binary codes produced by the row address buffers are transferred to row decoders, to execute select or non-select of row decoders. As a result of detecting the select or non-select of row decoders, a word line drive clock is generated. A word line WL which is provided corresponding to the word line drive clock is then selected. Data in memory cells M1, M2, M3 and M4 which are connected to the selected word line WL are transferred to the associated bit lines. The transferred data are amplified by respective bit line sense amplifiers SA1 to SA4. Next, the $\overline{CAS}$ clock is input, and column address signals are supplied to the ten column address buffers. Column address binary codes A0c to Anc in the MOS level are produced by column address buffers. Of these column address binary codes, eight codes are used for the select or the non-select of the column decoders. The remaining two codes are supplied to a decoder for selecting four input/output lines (I/O lines) $DQ_1$ to $DQ_4$. For example, the 256 column decoders (N=1 to 256) receive eight column address binary codes (A0c - Anc: n=8), and one column decoder (N) is selected. The selected column decoder N causes column select signal CSL to rise. Then, transfer gates or column select gates $Q_{801}$ to $Q_{804}$ are turned on. The data of four pairs of bit lines are respectively transferred to four pairs of I/O lines $DQ_1$ to $DQ_4$. In FIG. 1, the bit line pair is simplified by illustrating it as one line. The data transferred to I/O lines $DQ_1$ to $DQ_4$ are amplified by four output data amplifiers S1 to S4 which are activated by control signal QSE. Data readout gates $Q_{805}$ to $Q_{808}$ which are controlled by control signal QSE simultaneously with the signal amplification, are turned on. The data on I/O lines $DQ_1$ to $DQ_4$ are transferred to data output lines $RD_1$ to $RD_4$. The data on data output lines $RD_1$ to $RD_4$ are stored in output data latch circuits L1 to L4, each made up of a flip-flop. The stored data are converted from parallel to serial form by an output data shift register. Output data Dout is serially output from the data output terminal when data output data buffer is activated. A pointer control means is included in the output data shift register for deciding which data from data latch circuits L1 to L4 should be output first. Write data Din (or input data) input from an input data input terminal (not shown) via input data buffer, are transferred to an input data shift register. The data are sequentially supplied to input data latch circuits L1' to L4', in synchronism with the toggles of the $\overline{CAS}$ clock. When the input data are supplied to latch circuits L1' to L4', write gates $Q_{809}$ to $Q_{812}$ are kept turned on by write control signals WG.

As prior dRAMs, those with shift register lengths of 4 bits, 8 bits and 1024 bits have been used for the shift register length in the nibble mode. The operation of dRAM when the 4-bit length shift register is used usually in the nibble mode. The timing diagram illustrating the nibble mode operation is shown in FIG. 3. The operation mode when the 8-bit length shift register is used is called a bite mode, and may be illustrated as shown in FIG. 4. The operation mode when the 1024-bit length shift register is used is called an extended nibble mode, and operates as shown in FIG. 5. The bit length for the extended nibble mode differs with the length of the column of the memory cell array. It can take the values of 512 bits, 2,048 bits or 4,096 bits, for example.

In the read/write operations in this nibble mode, data can be input and output at a higher speed than in the normal mode of the prior art. When data are sequentially read out in the normal cycle, it is necessary, as shown in FIG. 6, to first return both $\overline{RAS}$ clock and $\overline{CAS}$ clock in logical state from "L" to "H", i.e., to return the clocks to a precharge state, and then to input row address signal Xi and column address signal Yi which are for addressing a desired memory location. Presence of the precharge period elongates the read/write cycle time.

The nibble mode, bite mode, and the extended nibble mode involve the following problem as to the high-speed operation. In the nibble mode of the prior art, the shift register has a 4 bit length. The data of 4 serial bits can be read and written in synchronism with the toggles of the $\overline{CAS}$ clock. As shown in FIG. 7, however, when data of 5 or more serial bits are processed, for example, read out, the output data R1 to R4 of 4 bits are first read out, and then precharge is performed, to return $\overline{RAS}$ clock and $\overline{CAS}$ clock to "H" level. Next, through the $\overline{RAS}/\overline{CAS}$ cycle, the operation for reading out the next 4-bit output data R5 to R8, is necessary. Therefore, it is evident that the mean cycle time is longer than the toggle of the $\overline{CAS}$ clock. The bite mode also involves the same problem as that of FIG. 7, as shown in FIG. 8 when the 9 or more successive bit output data is read out. The same thing is true for the data write operation. In the extended nibble mode of the prior art, data can be sequentially read and written through the mean cycle time approximately equal to the cycle time of the toggle of the $\overline{CAS}$ clock. However, to realize this extended nibble mode, 1,024 shift registers are required. Also, the number of I/O lines for transferring the outputs of sense amplifiers to the data output buffers, and for transferring the data from the data input buffer to the memory cells, must be increased. As a result, the chip area increases, and so does the manufacturing cost.

SUMMARY OF THE INVENTION

Accordingly, an object of this invention is to provide a semiconductor memory system with dynamic random access memory cells which sequentially read and write multi-bit data with relatively simple circuit construction and relatively low cost to manufacture.

A semiconductor memory system with dynamic random access memory cells which are integrated in a semiconductor substrate according to this invention comprises first and second memory banks, a plurality of the memory cells connected to a word line being arranged in each of the memory banks; read/write means for reading output data and writing input data from and into the memory cells, in which, while output data from the first memory bank latched in output data latching circuits are subsequently read out in synchronism with a column address strobe signal, output data from the memory cells of the second memory bank are transmitted to input/output lines and input data to be written into the memory cells of the first memory bank are latched subsequently in input data latching circuits in synchronism with the column address strobe signal, and in which, while output data from the memory cells of the second memory bank latched in the output data latching circuits are subsequently read out in synchronism with the column address strobe signal, output data from the memory cells of the first memory bank are transmitted to the input/output lines and input data to be written into the memory cells of the second memory bank are latched subsequently in the input data latching circuits in synchronism with the column address strobe signal, the read/write operations for the first and second memory banks being repeated alternatively.

In the dRAM according to this invention, the first group of memory cells coupled with one word line is arranged in the first memory bank. The second group of memory cells is arranged in the second memory bank. The read/write operation of data is performed between each memory bank and I/O lines, in a time divisional manner. This invention allows the memory system using the shift register of 4 bits length to be operable in a mode substantially equal to the extended nibble mode.

BRIEF DESCRIPTION OF THE DRAWINGS

FIG. 9 shows a wiring diagram illustrating a part of a first embodiment of a dynamic random access memory system according to this invention;

FIG. 10 shows an operation timing diagram of the FIG. 9 embodiment;

FIGS. 11A to 11C, 12, 13, and 14 cooperate to show a circuit diagram of the generating circuit for generating column select signals for first and second memory banks of FIG. 9;

FIGS. 17 and 18 show timing diagrams for the second embodiment of FIG. 16;

FIGS. 19 to 22 cooperate to show a circuit diagram of a column select signal generating circuit for first and second memory banks in FIG. 16;

FIG. 25 shows a wiring diagram illustrating a part of a third embodiment of the random access memory system according to this invention;

FIG. 31 shows a circuit diagram of a generating circuit for generating various control signals in FIG. 30;

DETAILED DESCRIPTION OF THE PREFERRED EMBODIMENTS

Figure 1:
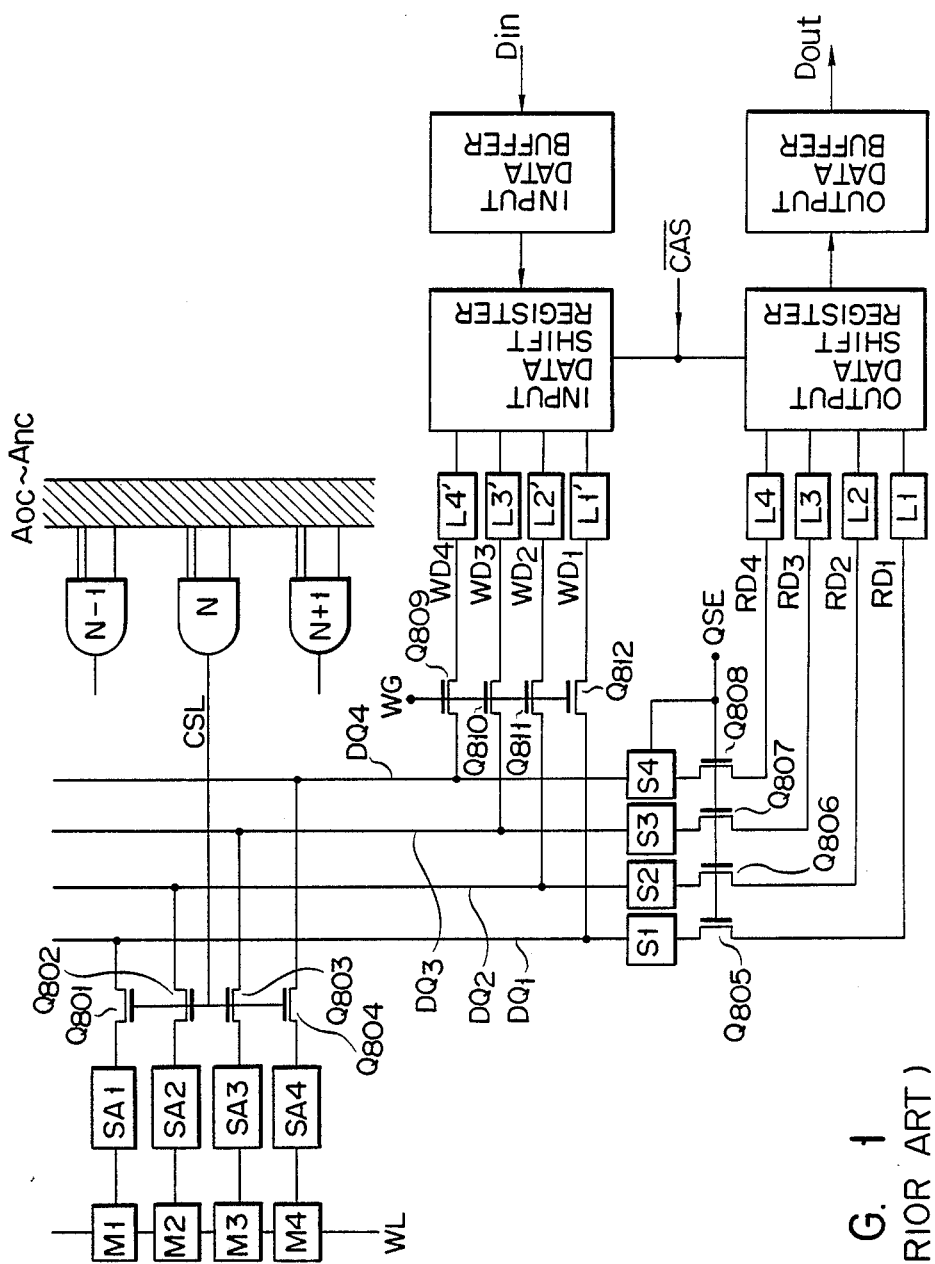
FIG. 1 shows a wiring diagram illustrating a part of a prior art nibble mode dynamic random access memory system.
Figure 2:
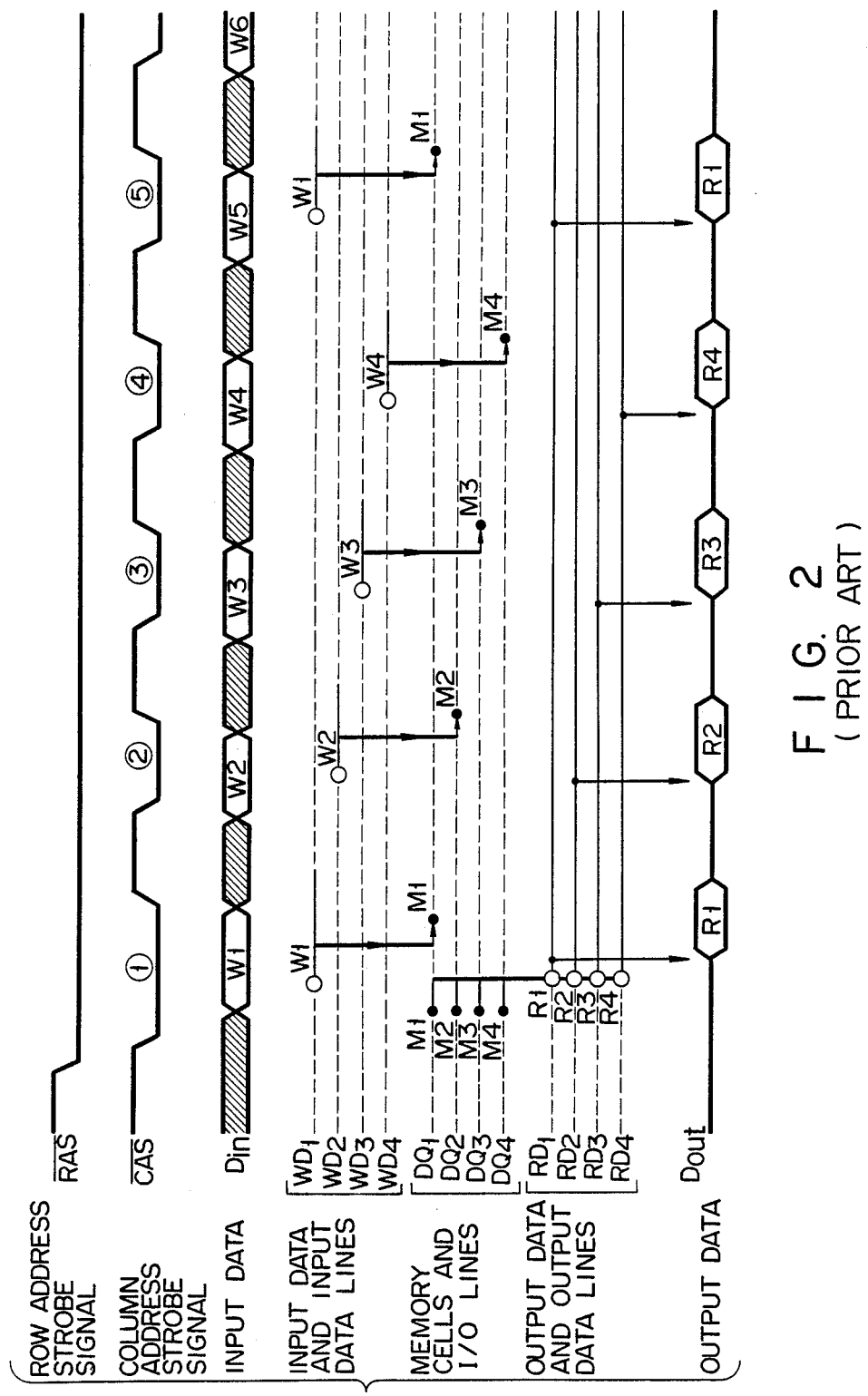
FIG. 2 shows an operation timing diagram of the FIG. 1 memory system.
Figure 3:
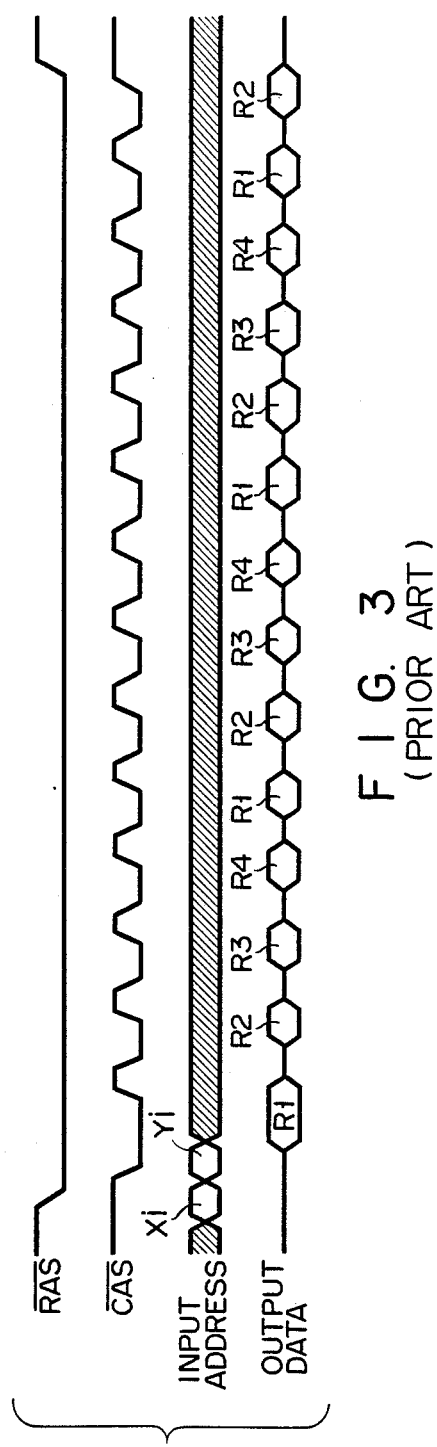
FIG. 3 shows a timing diagram for explaining the operation of the prior art nibble mode.
Figure 4:
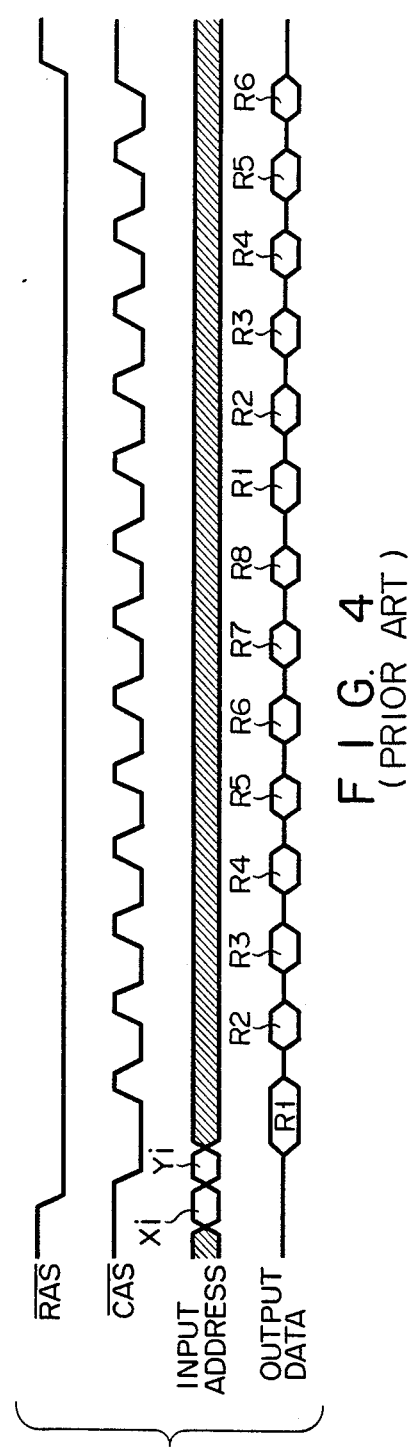
FIG. 4 shows a timing diagram for explaining the operation of the prior art bite mode.
Figure 5:
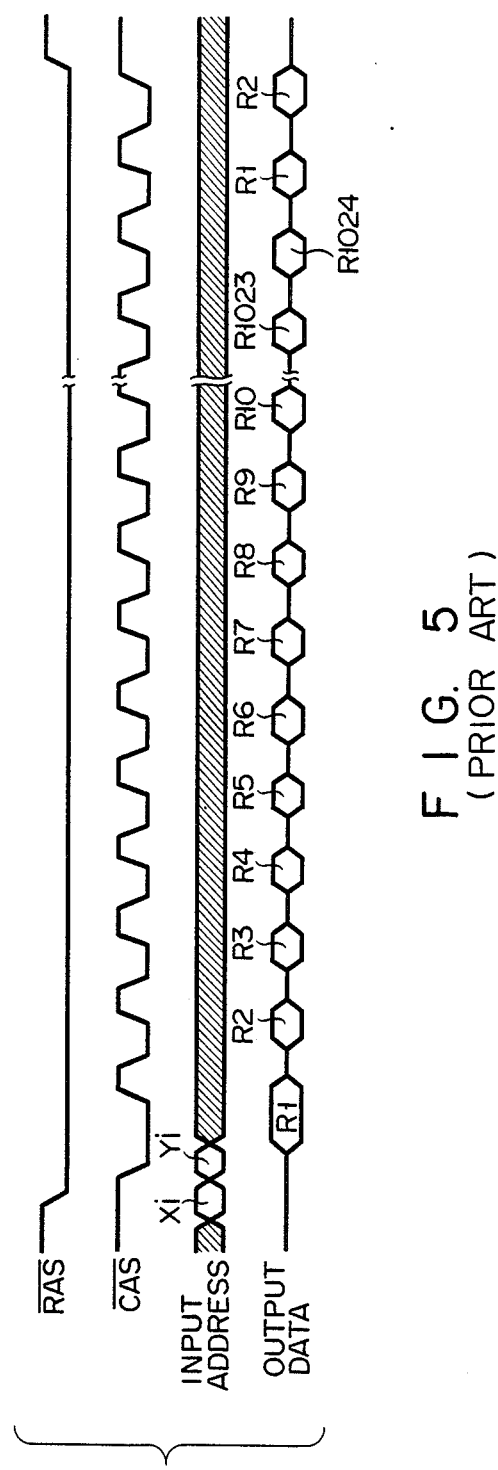
FIG. 5 shows a timing diagram for explaining the operation of the prior art extended nibble mode.
Figure 6:
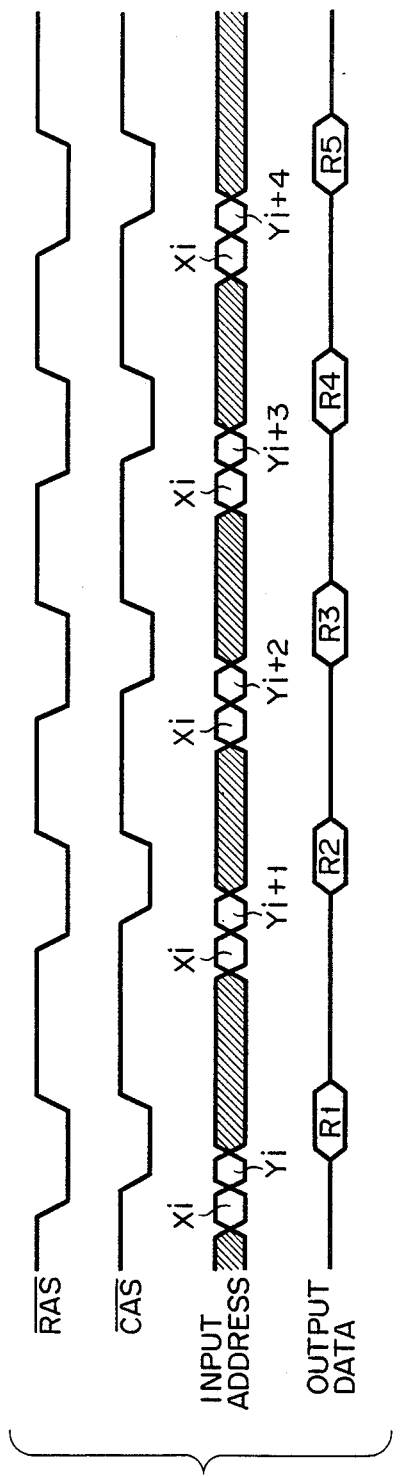
FIG. 6 shows an operation timing diagram for explaining the problem to be solved of the prior art nibble mode.
Figure 7:
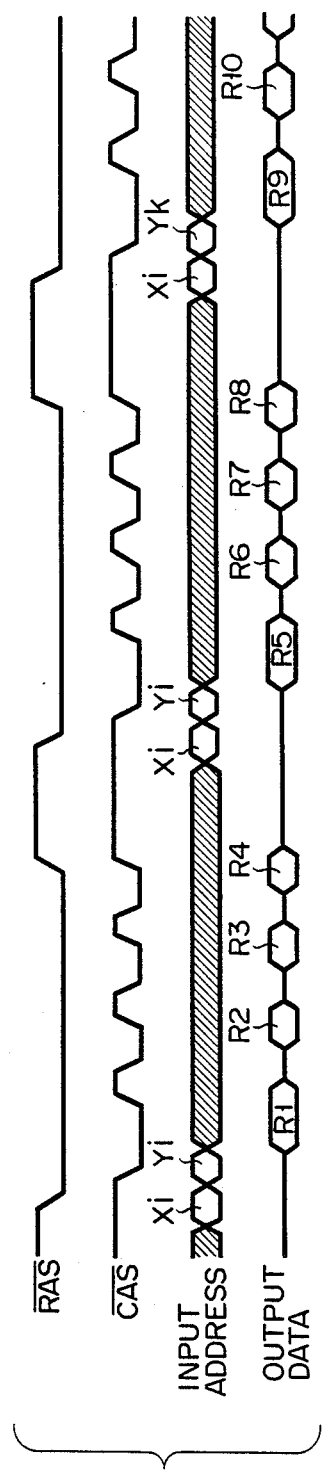
FIG. 7 shows an operation timing diagram for explaining the problem to be solved of the prior art bite mode.
Figure 8:
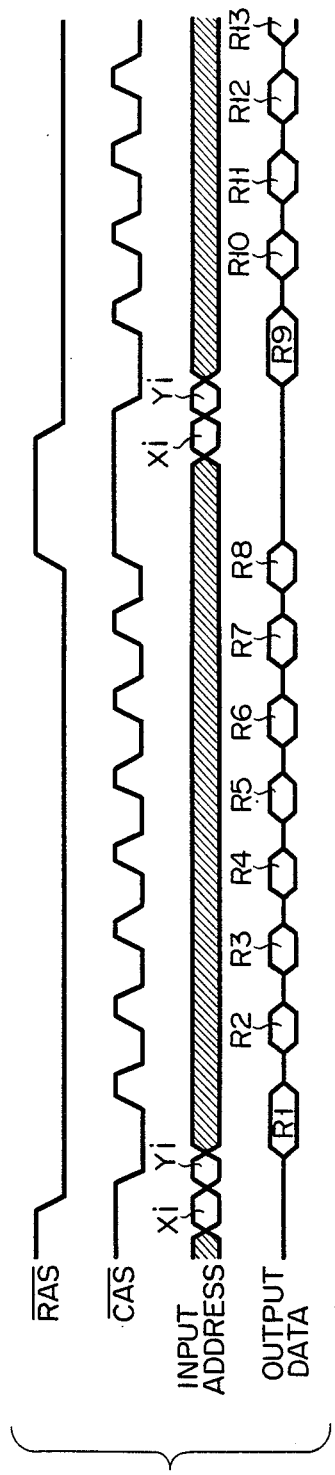
FIG. 8 shows an operation timing diagram for explaining the problem to be solved of the prior art extended nibble mode.

FIG. 9 shows a wiring diagram of a part of a first embodiment of a dRAM (dynamic random access memory) according to this invention, that is, only the portion of the embodiment that is driven by one word line WL. A plurality of memory cells connected to word line WL are arranged into first memory bank $1_1$ and second memory bank $1_2$. Four memory cells M1 to M4, for example, of first memory bank $1_1$ are connected to I/O lines 3 via bit line sense amplifiers $2_1$ and transfer gates (column select gates) $4_1$. Four memory cells M5 to M8, for example, of second memory bank $1_2$ are connected to I/O lines 3 via bit line sense amplifiers $2_2$ and transfer gates (column select gates) $4_2$. The data transfer between first memory bank $1_1$ and I/O lines 3 is controlled by first memory bank select signals CSLA (CSLA$_1$, CSLA$_2$...). The data transfer between second memory bank $1_2$ and I/O lines 3 is controlled by second memory bank select signals CSLB (CSLB$_1$, CSLB$_2$...). Four I/O lines DQ$_1$ to DQ$_4$ are illustrated for four I/O lines 3. For convenience of description, one I/O line represents a pair of lines. I/O lines 3 are connected to output data sense amplifiers 5 and read control gates 6. Output data sense amplifiers 5 are activated by control signal QSE. Read control gates 6 are turned on and off by control signal QSE. Parallel data read out via read control gates 6 are latched in output data latch circuits 7. The latched data are converted into serial data by output data shift register 8. The serial data are read out as Dout from output data buffer 9. Reference numeral 13 denotes an input data buffer. Series data Din to be input from input data buffer 13 to input data shift register 12 are converted into parallel data. The parallel data are transferred to I/O lines 3 via input data latch circuits 11 and write control gates 10.

The operation of the dRAM shown in FIG. 9 in the extended nibble mode, will be described, referring to FIGS. 10 to 15. In FIG. 10, the $\overline{RAS}$ clock goes from "H" to "L", the voltage of word line WL increases, and a word line WL is selected. The operation of this dRAM till this point is the same as that of the prior art. After the word line WL is selected, transfer gates (or column select gates) $4_1$ are turned on by a column select signal CSLA$_1$ for first memory bank $1_1$. Then, the output data of 4 bits in memory cells M1 to M4 of first memory bank $1_1$ are transferred in parallel from the bit lines to I/O lines 3. After the output data are transferred, output data amplifiers 5 are activated and read control gates 6 are turned on at the same time, both by a control signal QSE. The output data on I/O lines 3 are read out in parallel to data output lines RD1 to RD4. The output data are then latched in output data latch circuits 7. When they are latched, control signal QSE goes "L" again, and I/O lines 3 are electrically disconnected from output data latch circuits 7. The latched 4-bit output data are converted into serial data by output data shift register 8, in synchronism with the toggles of the $\overline{CAS}$ clock. These series data are output from output data buffer 9, as output data R1 to R4. When output data R1 to R4 are output, write data W1 to W4 to be written into memory cells M1 to M4 from which the data has been read out, are supplied from input data buffer 13 to input data shift register 12 in synchronism with the toggles of the $\overline{CAS}$ clock, and there the data are converted into parallel data. The parallel data are input to data latch circuits 11. At the time point that the data is latched, write control signal WG is at "L". Therefore, input data latch circuits 11 and I/O lines 3 are disconnected from one another. In the period of toggles ① to ④ of the $\overline{CAS}$ clock, column select signal CSLA$_1$ of first memory bank $1_1$ goes from "H" to "L", and the bit lines of first memory bank and I/O lines 3 are electrically disconnected from one another. I/O lines 3 are then precharged.

Afterwards, column select signal CSLB$_1$ of second memory bank $1_2$ goes "H", and the output data in memory cells M5 to M8 of second memory bank $1_2$ are transferred to I/O lines via transfer gates $4_2$. The transferred data are latched in output data latch circuits 7 via output data amplifiers 5 and read control gates 6. The latched data is converted into serial data by output data shift register 8, in synchronism with the toggles of the $\overline{CAS}$ clock. The serial data are taken out from output data buffer 9 as output data R5 to R8.

After the output data in memory cells M5 to M8 of second memory bank $1_2$ are latched in output data latch circuits 7, control signal QSE is returned to "L", and I/O lines 3 and data output lines RD$_1$ to RD$_4$ are electrically disconnected from one another, and I/O lines 3 are then immediately precharged. After the precharge, write control signal WG goes "H", and the data to be written into memory cells M5 to M8 of second memory bank $1_2$ that has been latched in input data latch circuits 11 is transferred to I/O lines 3 via write control gates 10. At this time, write data W1 to W4 to be written into first memory bank $1_1$ are written into memory cells M1 to M4, because the column select signal CSLA$_1$ of first memory bank $1_1$ goes "H" again. When write data W1 to W4 are written into memory cells M1 to M4, write control gates 10 are disabled. Write data W5 to W8 to be next written into second memory bank $1_2$ are input to input data latch circuits $1_1$, and held there.

The sequence of reading output data from first memory bank $1_1$ and second memory bank $1_2$, and of writing input data into the memory cells from which data has been read out, is repeated. In this way, data, of 1024 bits for example, can be successively read out of and written into all memory cells coupled with the selected single word line WL.

Figure 15:
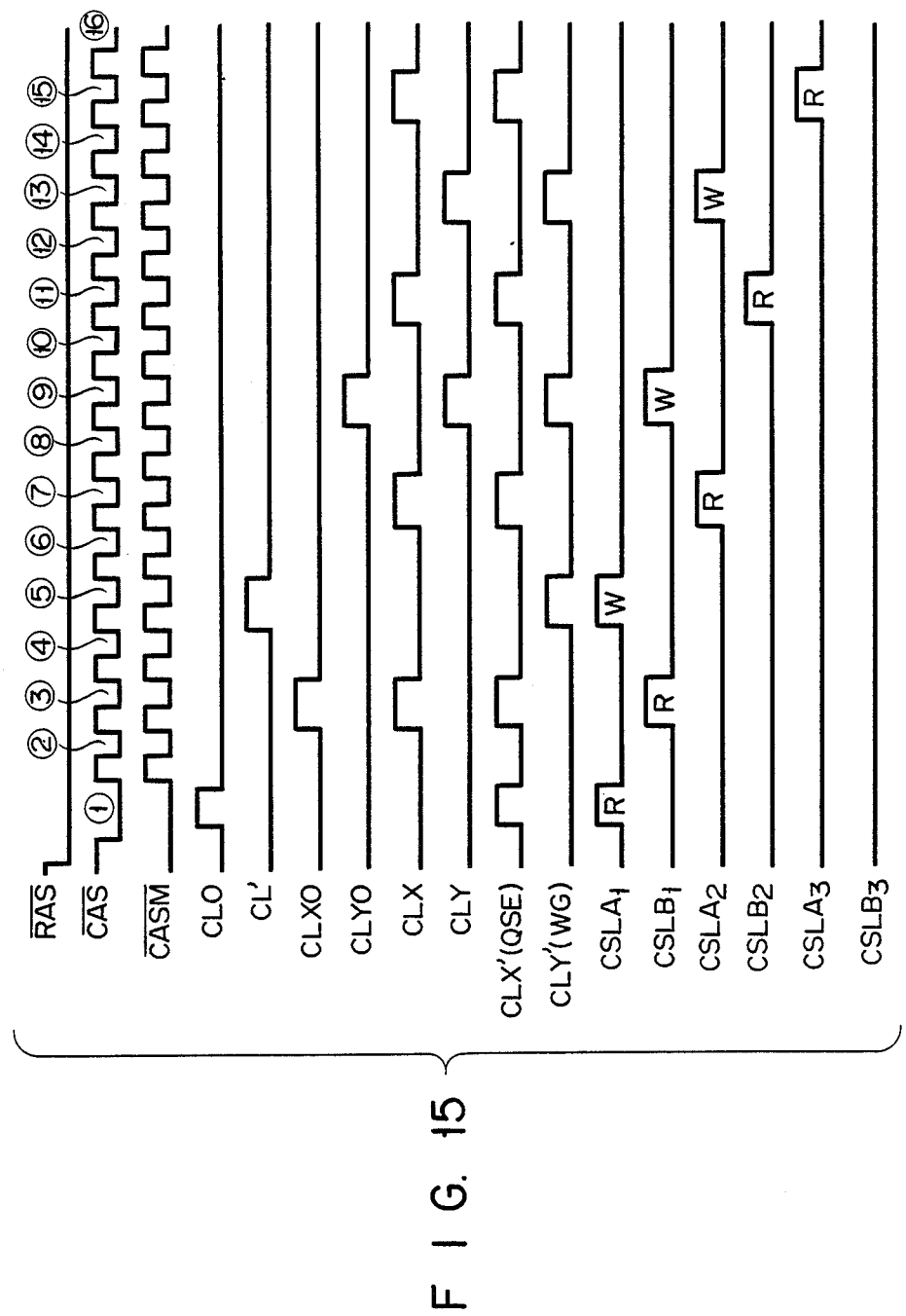
FIG. 15 shows a timing diagram of the signals in FIGS. 11A to 11C, 12, 13, and 14.

Column select signals CSLA$_1$, CSLA$_2$ . . . for first memory bank $1_1$ and column select signals CSLB$_1$, CSLB$_2$ . . . for second memory bank $1_2$, are generated by using a counter which counts the column address binary code obtained from the column address buffer in synchronism with the toggles of the $\overline{CAS}$ clock. The detailed circuit configuration of the generating means is shown in FIGS. 11A to 11C and 12 to 14. The operation timings of the generating means are shown in FIG. 15. Column select signals CSLA and CSLB for first and second memory banks $1_1$ and $1_2$ contain write pulse W and read pulse R, as shown in FIG. 15. Each of the first and second memory banks generates the pulse train including pulses W and R every eight toggles of the $\overline{CAS}$ clock. These memory banks, as a whole, generate the pulse train every four toggles.

In FIG. 11A, reference numerals 21 and 22 denote level converting circuits for converting the reference level of the $\overline{RAS}$ clock and $\overline{CAS}$ clock from the TTL level to the MOS level. The $\overline{CAS}$ clock in MOS level is $\overline{CASM}$. FF (flip-flop) 24 is set by signal $\overline{CASM}$. FF 24 is reset by the $\overline{RAS}$ clock in MOS level which is delayed by a predetermined time $\tau$ in delay circuit 23. Clock CLO is obtained by delaying the output of FF 24 by delay circuit 25 by a predetermined time $\tau$. Clock CLO is input to a group of eight D-type FFs. Clocks CLX0, CL' and CLY0 which are delayed by a predetermined time behind clock CL0, are respectively obtained from the second, fourth and eighth FFs. Clocks CLX0 and CLY0 are respectively input to D FF groups 27 and 28 which are each made up of 4 series FFs (FIGS. 11B and 11C). In each of FF groups 26 and 27, the output of the fourth FF is fed back to the first FF. FF groups 26, 27 and 28 operate in synchronism with the toggles of signal $\overline{CASM}$ or the $\overline{CAS}$ clock. Clock CLX' is obtained as the sum of clocks CLX and CL0. Clock CLY' is obtained as the sum of clocks CLY and CL0.

Clock CLX' is counted by an 8-bit binary counter, as shown in FIG. 12. As shown in the figure, the bit outputs of this binary counter are $A_{0x}$, $\overline{A_{0x}}$, $A_{1x}$, $\overline{A_{1x}}$... Clock CLY' is counted by an 8 bit binary couter, as shown in FIG. 13. The bit of this binary counter are $A_{0y}$, $\overline{A_{0y}}$, and $A_{1y}$, $\overline{A_{1y}}$ $\overline{A_{1y}}$...

As shown in FIG. 14, the sum $A_{0x}$ and $A_{0y}$, $\overline{A_{0x}}$ and $\overline{A_{0y}}$, ... $A_{7x}$ and $A_{7y}$, and $\overline{A_{7x}}$ and $\overline{A_{7y}}$ are respectively denoted by $A_{0c}$, $\overline{A_{0c}}$, ... $A_{7c}$, and $\overline{A_{7c}}$. These sums are output to column decoder 16. The outputs of column decoder 16 are used as column select signals $CSLA_1$, $CSLB_1$, $CSLA_2$, $CSLB_2$, ... for first and second memory banks $1_1$ and $1_2$. These signals include read pulse R and write pulse W, and are delayed by a predetermined time.

In the embodiment of FIG. 9, while output data R1 to R4 of first memory bank $1_1$ latched in output data latch circuits 7 are read out in synchronism with the toggles of the column address strobe signal ($\overline{CAS}$), output data R5 to R8 from second memory bank $1_2$ are transmitted to I/O lines 3, and input data W1 to W4 to be written into the memory cells of first memory bank $1_1$ from which data R1 to R4 is read out, is sequentially latched in input data latch circuits 11, in synchronism with column address strobe signal $\overline{CAS}$. Also, while output data R5 to R8 of second memory bank $1_2$ latched in output data latch circuits 7 are sequentially read out in synchronism with the toggles of column address strobe signal $\overline{CAS}$, the output data R9 to R12 from first memory bank $1_1$ are transmitted to I/O lines 3, and input data W5 to W8, to be written into second memory bank $1_2$ from which data R9 to R12 are read out, are sequentially latched in input data latch circuits 11, in synchronism with the toggles of column address strobe signal $\overline{CAS}$. The shift register has a length of 4 bits. It should be understood that the bit length of the shift register is not limited to such a figure, but may be set to an 8-bit or 16-bit length, and that the data are read and written every 8 bits or 16 bits. In other words, the extended nibble mode operation can be realized.

As seen from the foregoing description, this invention can realize the extended nibble mode operation, which reads and writes data at high speed, viz. through the mean access cycle equal to the toggle of the $\overline{CAS}$ signal, with a fewer number of I/O lines and a shorter bit length of shift register than those required for the prior extended nibble mode operation. This invention requires the same number of I/O pins in the memory system as that for the prior art, and allows the same layout of those pins as in the prior art. Additionally, the dRAM of this invention is compatible with the prior dRAM. These facts imply that this invention can provide the memory system operable in the extended nibble mode at high speed and with high performances, but requiring a less chip area for IC fabrication.

Next, a second embodiment of this invention will be described. In the second embodiment, I/O lines dedicated to the first memory bank and I/O lines to the second memory bank are provided. Therefore, it is possible to transfer the output data of the second memory bank to the I/O lines for the second memory bank, when the output data of the first memory bank are read out to the I/O line for the first memory bank. Also, the output data of the second memory bank can be output via the second memory bank I/O lines, when the input data to the first memory bank is written into the cells of the first memory bank via the first memory bank I/O lines. In this embodiment, a write control gate is connected between each input data latch circuit and the associated I/O line, so that the data in each input data latch circuit can be transferred independently to the I/O line. Therefore, the extended nibble mode operation can be changed for each bit, that is to say, the data length can be appropriately selected.

Figure 16A:
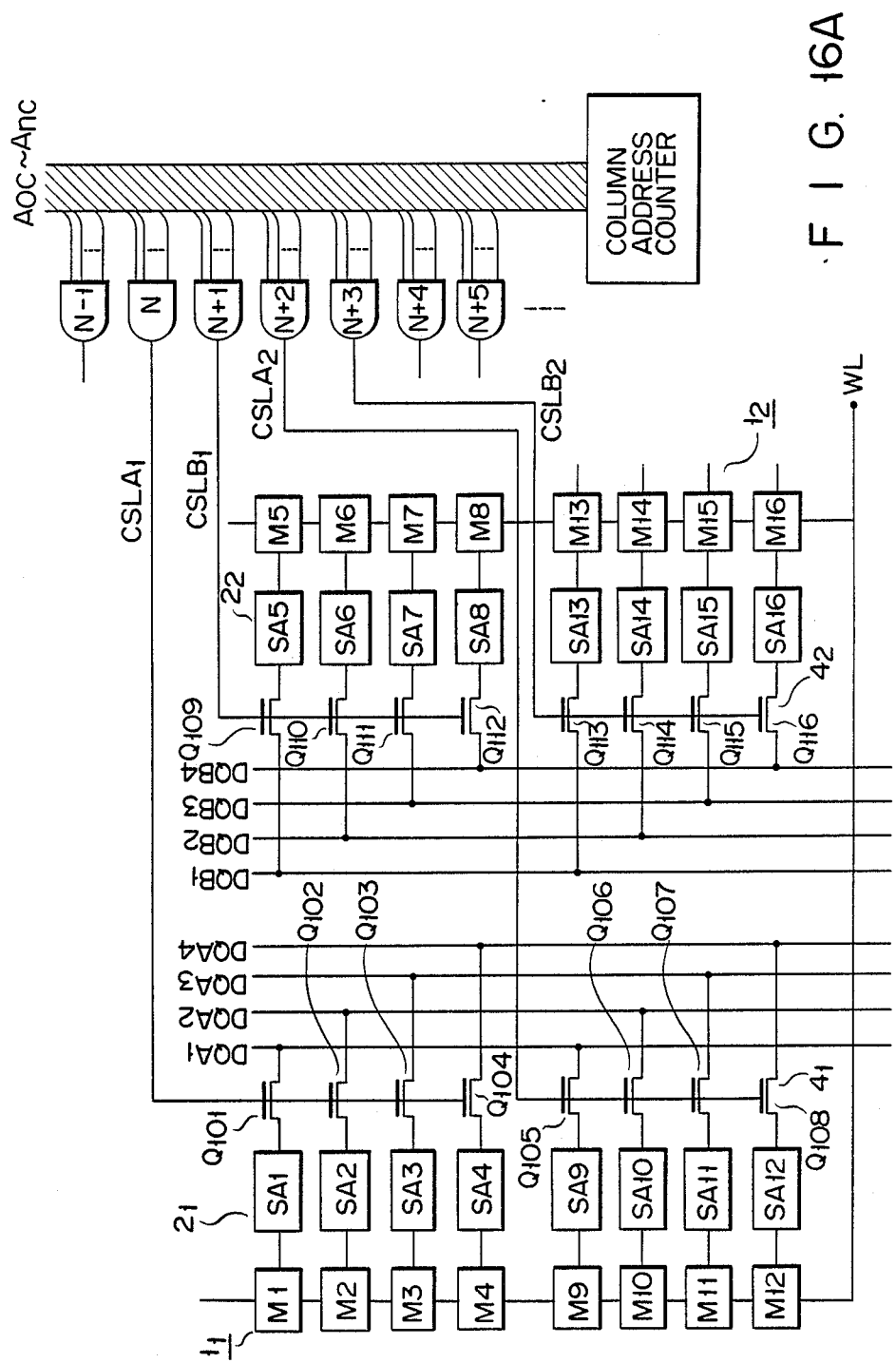
FIGS. 16A and 16B show, respectively, a wiring diagram illustrating a part of a second embodiment of a random access memory system according to this invention.
Figure 16B:
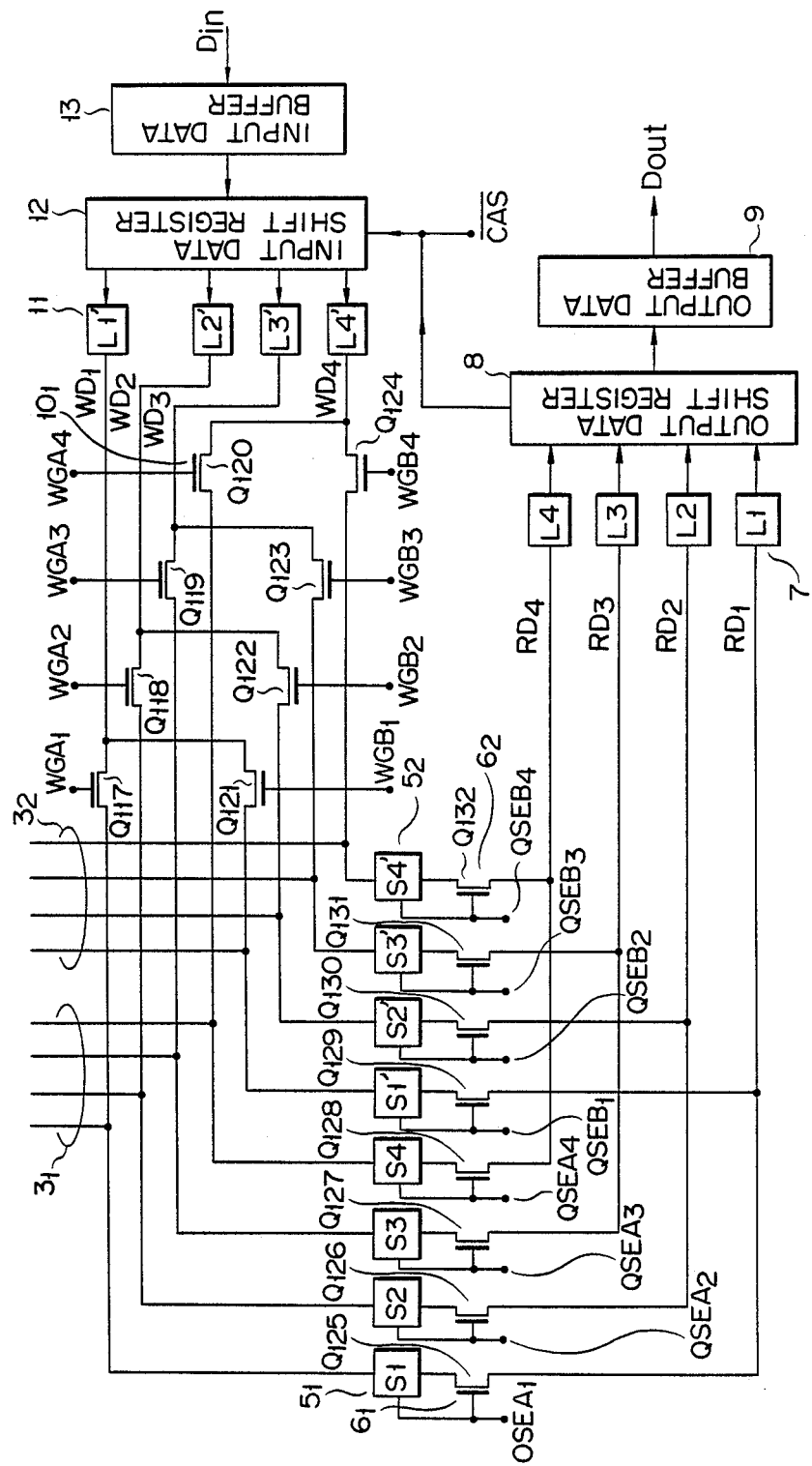

The configuration of the second embodiment will be described, referring to the accompanying drawings. FIGS. 16A and 16B jointly show the portion of the embodiment that is driven by one word line WL. A plurality of memory cells, for example, M1 to M16, which are connected to the same word line WL, are arranged into first and second memory banks $1_1$ and $1_2$. Memory cells M1 to M4 and M9 to M12 of first memory bank $1_1$ are connected to dedicated I/O lines $3_1$ (DQA1 to DQA4) via bit line sense amplifiers $2_1$ (SA1 to SA4, SA9 to SA12), and transfer gates $4_1$ (MOS transistors $Q_{101}$ to $Q_{104}$ and $Q_{105}$ to $Q_{108}$). Memory cells M5 to M8, and M13 to M14 of second memory bank $1_2$ are connected to dedicated I/O lines $3_2$ (DQB1 to DQB4) via bit line sense amplifiers $2_2$ (SA5 to SA8, SA13 to SA16) and transfer gates $4_2$ (MOS transistors $Q_{109}$ to $Q_{112}$ and $Q_{113}$ to $Q_{116}$). The control of data input/output between the memory cells of first memory bank $1_1$ and I/O lines $3_1$ is performed by column select signals $CSLA_1$, $CSLA_2$... of first memory bank $1_1$. The data input/output between the memory cells of second memory bank $1_2$ and I/O lines $3_2$ is controlled by column select signals $CSLB_1$, $CSLB_2$, ... of second memory bank $1_2$. I/O lines DQA1 to DQA4, and DQB1 to DQB4 are each represented by one line, but actually each include a pair of lines.

I/O lines $3_1$ are sequentially connected to output data amplifiers $5_1$ (S1 to S4) which are activated by control signals $QSEA_1$ to $QSEA_4$, and read control gates $6_1$ (MOS transistors $Q_{125}$ to $Q_{128}$) which are enabled by the control signals. I/O lines $3_2$ are respectively connected to output data amplifiers $5_2$ (S1' to S4') which are activated by read control signals $QSEB_1$ to $QSEB_4$, and read control gates $6_2$ (MOS transistors $Q_{129}$ to $Q_{132}$) which are enabled by the read control signals. The parallel data of 4 bits read out via read control gates $6_1$ and $6_2$ are each stored in output data latch circuits 7. The latched parallel data are converted into serial data by output data shift register 8. The serial data are read out from output data buffer 9. On the other hand, input data to be written into memory cells are supplied serially from input data buffer 13 to input data shift register 12, where the serial data is converted into parallel data. The parallel data is loaded into and latched in input data latch circuit 11. The input data latched in latch circuits 11 are transferred to I/O lines $3_1$ via write control gates $10_1$ (MOS transistors $Q_{117}$ to $Q_{120}$), or to I/O lines $3_2$ via write control gates $10_2$ (MOS transistors $Q_{121}$ to $Q_{124}$). The control electrodes of the write control gates $10_1$ and $10_2$ are each controlled so that 4-bit data from input latch circuit 11 is transferred at different timings to the associated I/O lines.

Figure 17:
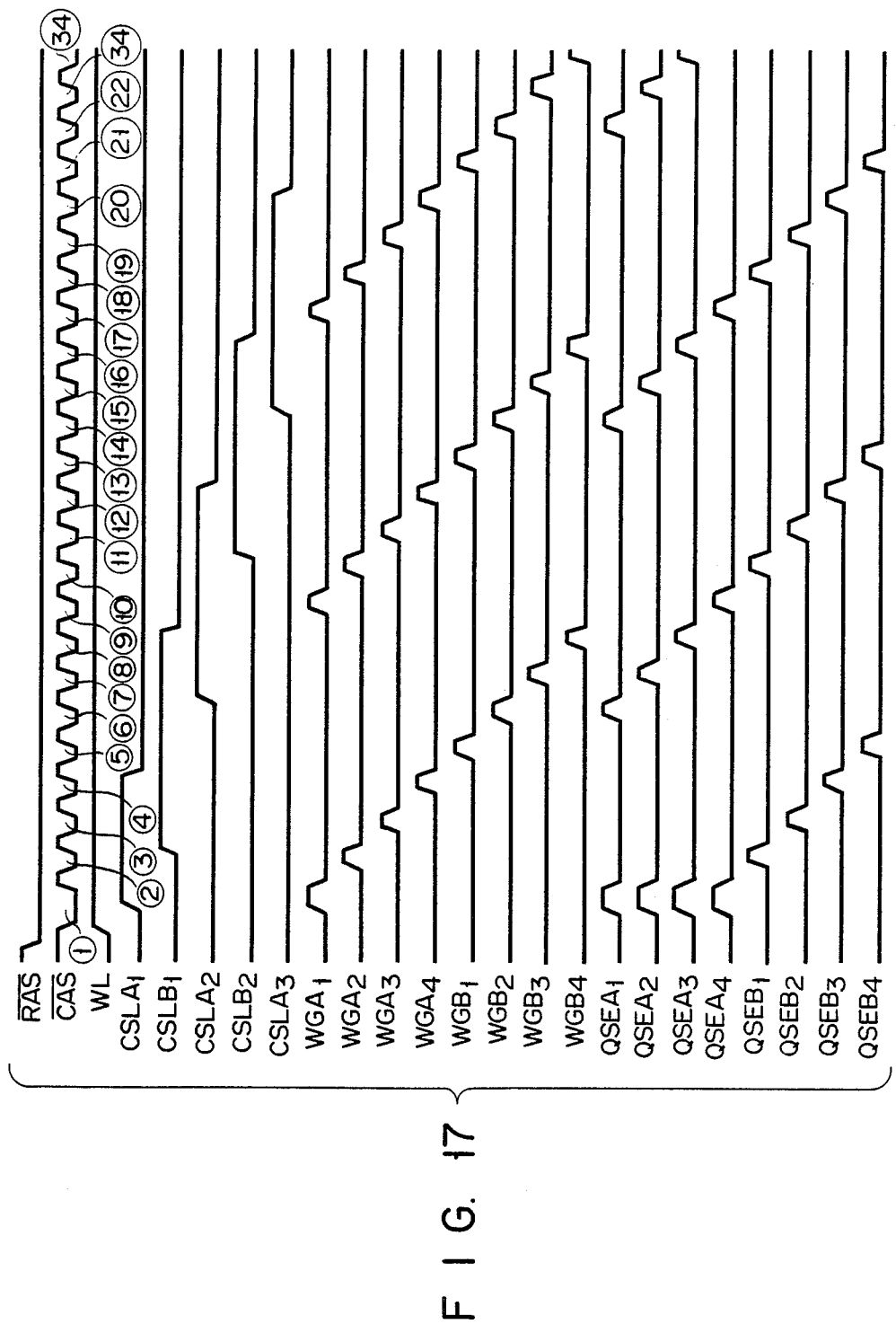

The extended nibble mode operation of the second embodiment constructed as shown in FIG. 16 will be described, referring to FIGS. 17 and 18.

The same operation as that of the prior art will be continued till the $\overline{RAS}$ clock goes from "H" to "L" and the voltage of the selected word line WL increases. After the word line WL is selected, MOS transistors $Q_{101}$ to $Q_{104}$ of transfer gates $4_1$ are turned on by column select signals $CSLA_1$ of first memory bank $1_1$ that is generated by the column address counter. 4-bit output data from the memory cells M1 to M4 of first memory bank $1_1$ are transferred to I/O lines $3_1$ via the bit lines and bit line sense amplifiers $2_1$. When the 4-bit output data are transferred, activate signals $QSEA_1$ to $QSEA_4$ simultaneously rise. Then, output data amplifiers $5_1$ are activated, while at the same time read control gates $6_1$ are turned on. The output data of I/O lines $3_1$ is read out to data output lines $RD_1$ to $RD_4$. The read-out output data is latched in output data latch circuits 7. The reason that activate signals $QSEA_1$ to $QSEA_4$ simultaneously rise is to read out the pointer data at a high speed. Activate signals $QSEA_1$ to $QSEA_4$ are simultaneously generated at the time of the first toggle ①. At the remaining toggles, activate signals $QSEA_1$ to $QSEA_4$ and $QSEB_1$ to $QSEB_4$ rise at different timings in synchronism with the toggles. 4-bit output data latched in output data latch circuits 7 are converted into serial data by output data shift register 8, in synchronism with the toggles ①, ②, ③ and ④ of the $\overline{CAS}$ clock. The converted data is output from data buffer 9 as serial data R1 to R4.

Input data W1 to W4 are written into memory cells M1 to M4 of first memory bank 11 in the following way. Input data W1 to W4 are supplied from input data buffer 13 to input data shift register 12, in synchronism with the toggles ①, ②, ③ and ④ of the $\overline{CAS}$ clock, and are sequentially latched into input data latch circuits 11. Input data W1 to W4 are transferred to I/O lines $3_1$, since every time these pieces of data are latched, MOS transistors $Q_{117}$ to $Q_{120}$ of write control gates $10_1$ are sequentially turned on, in synchronism with the toggles of the $\overline{CAS}$ clock. During the transfer, MOS transistors $Q_{101}$ to $Q_{104}$ are turned on by column select signals $CSLA_1$ of first memory bank $1_1$. Therefore, the input data W1 to W4 as transferred to I/O lines $3_1$ are written into the memory cells M1 to M4 of first memory bank $1_1$. After the data are written, column select signal $CSLA_1$ goes "L".

As described above, output data R5 to R8 from memory cells M5 to M8 of second memory bank $1_2$ are transferred to I/O lines $3_2$, because column select signal $CSLB_1$ goes "H" when the read of output data from the memory cells of first memory bank $1_1$ and the write of input data into these memory cells are performed in synchronism with the toggles ① to ④ of the $\overline{CAS}$ clock. The output data R5 to R8 transferred to I/O lines $3_2$ are latched in output latch circuits 7, because activate signals $QSEB_1$ to $QSEB_4$ sequentially rise in synchronism with the toggles of the $\overline{CAS}$ clock. The latched output data from memory cells M5 to M8 are converted into serial data in synchronism with toggles ⑤, ⑥, ⑦ and ⑧ of the $\overline{CAS}$ clock. The converted data are output from output data buffer 9, as serial output data R5 to R8.

Input data M5 to M8 to be written into memory cells M5 to M8 of second memory bank $1_2$ are supplied from input data buffer 13 to input data shift register 12, in synchronism with toggles ⑤, ⑥, ⑦ and ⑧ of the $\overline{CAS}$ clock, and then sequentially stored into input data latch circuits 11. The latched input data W5 to W8 are transferred to I/O lines $3_2$ because MOS transistors $Q_{121}$ to $Q_{124}$ of write control gates $10_2$ are sequentially turned on in synchronism with toggles ⑤ to ⑧ of the $\overline{CAS}$ clock each time the data W5 to W8 are latched. The transferred input data W5 to W8 are written into memory cells M5 to M8 of second memory bank $1_2$, because column select signal $CSLB_1$ of second memory bank $1_2$ is kept at "H" level during the data transfer. When the write operation completes, column select signal $CSLB_1$ goes "L".

Thereafter, the output data are read out from first and second memory banks $1_1$ and $1_2$ since column select signals $CSLA_2$, $CSLB_2$, ..., produced by column address counter sequentially go "H". The input data are written into these memory banks. This sequence of read/write operations is repeated. As shown in FIG. 17, during only the first initial output data readout and the input data write, the time length of the column select signal, for example, $CSLA_1$, is equal to 4 toggles. The other column select signals $CSLB_1$, $CSLA_2$, $CSLB_2$, ... are equal to 6 toggles in time length. These column select signals are sequentially produced, each delayed by the time equal to 4 toggles behind the preceding one. In this way, the data, of 1,024 bits for example, in all the memory cells that are connected to one word line, are sequentially read out and written in.

The second embodiment is the same as the first embodiment in that column select signals $CSLA_1$, $CSLA_2$, ... for first memory bank $1_1$ and column address signals for second memory bank $1_2$ can be produced by using the counter which counts the column address binary codes obtained from the column address buffer, in synchronism with the toggles of the $\overline{CAS}$ clock. The specific configuration of the generating means is shown in FIGS. 11A to 11C (for the first embodiment), and FIGS. 19, 20, 21, 22, 23A, and 23B. The operation timings are shown in FIG. 24. As shown in FIG. 24, column select signals CSLA ($CSLA_1$, $CSLA_2$, ...) and CSLB ($CSLB_1$, $CSLB_2$...) of first and second memory banks contain pulses represented by "R-W". During the rise period of the "R-W" pulse, the read and write of data are performed.

The description of FIGS. 11A to 11C has already been given for the first embodiment of FIG. 9. Therefore, the description will be omitted here.

As shown in FIG. 19, clock CLX' (FIG. 11B) is separated into the CLXA pulse signal of odd-numbered pulse train and CLXB pulse signal of even-numbered pulse train. Similarly, clock CLY' (FIG. 11C) is separated into the CLYA of odd-numbered pulse train and the CLYB of even-numbered pulse train. An A-clock rises at the leading edge of clock CLXA, while it falls at the trailing edge of clock CLYA. A B-clock rises at the leading edge of clock CLXB, while it falls at the trailing edge of clock CLYB.

Figure 20:
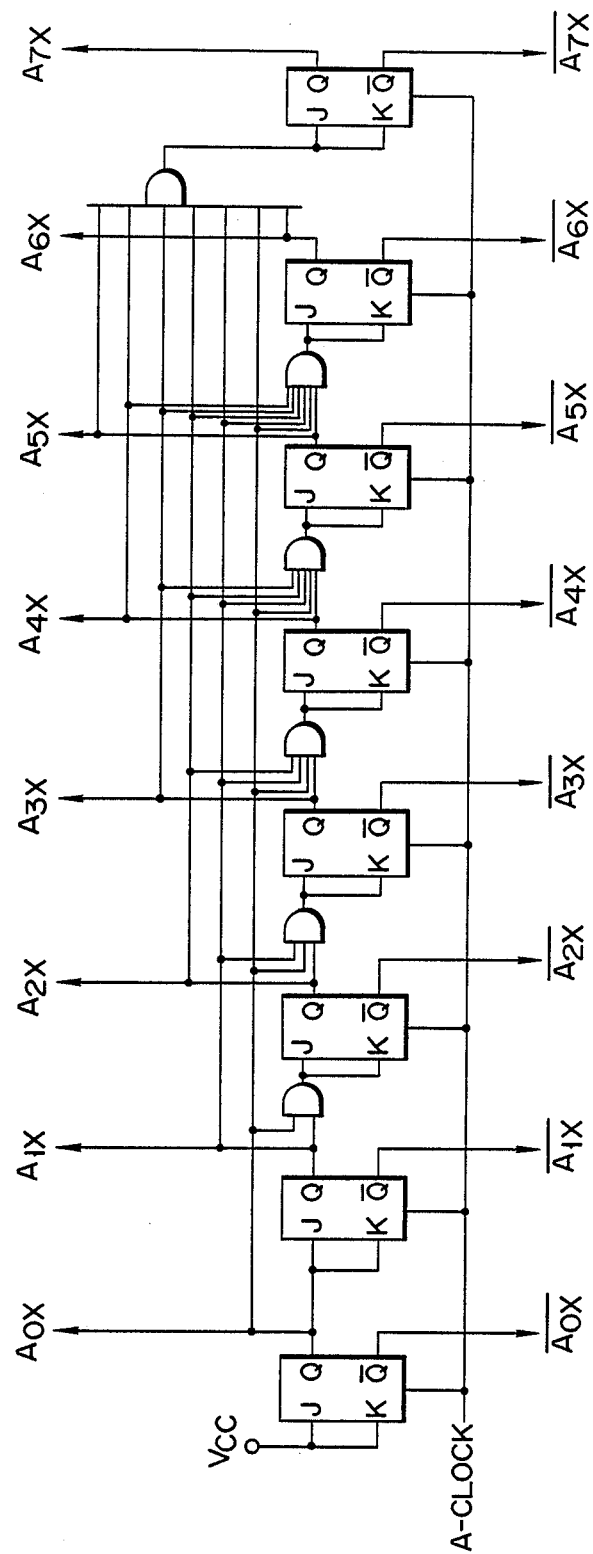
Figure 21:
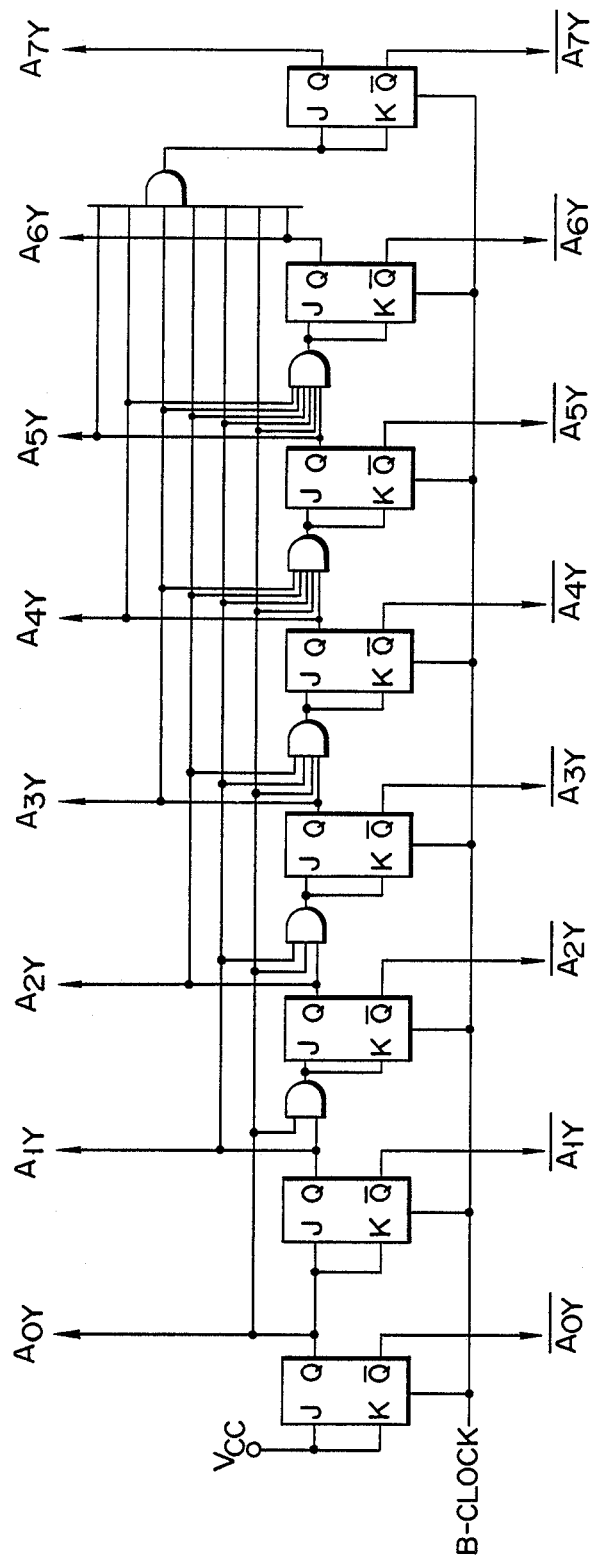

The A-clock is counted by an 8 bit binary counter, as shown in FIG. 20. The bit outputs of this counter are respectively denoted as $A_{0x}, \overline{A_{0x}}, A_{1x}, \overline{A_{1x}}, \ldots$. Similarly, the B-clock is counted by an 8 bit binary counter, as shown in FIG. 21. The bit outputs of this counter are respectively denoted as $A_{0y}, \overline{A_{0y}}, A_{1y}, \overline{A_{1y}}$.

Figure 22:
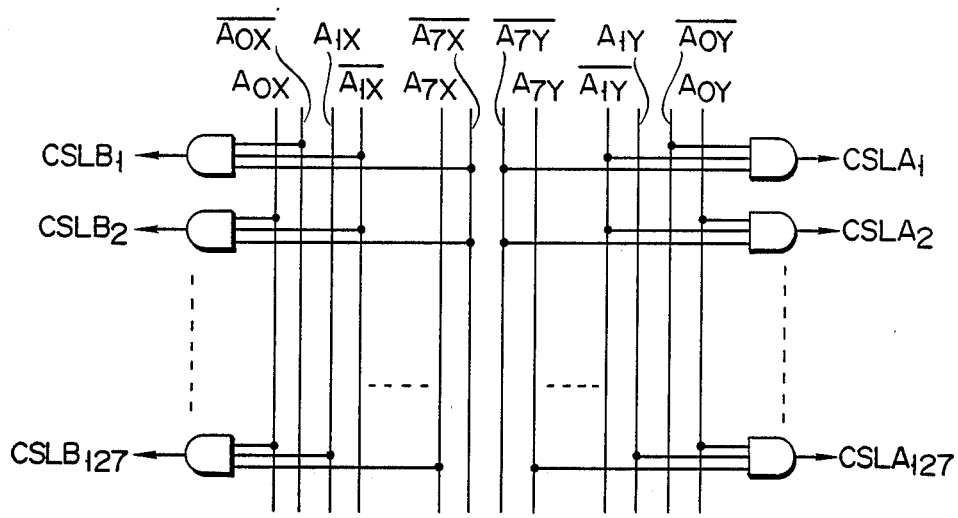

As shown in FIG. 22, the pairs $A_{0x}, A_{0y}; \overline{A_{0x}}$ and $\overline{A_{0y}}$; ... $A_{7x}$ and $A_{7y}$; and $\overline{A_{7x}}$ and $\overline{A_{7y}}$, are respectively input to different column decoders. The outputs of these column decoders are used as first and second column select signals $CSLA_1$, $CSLB_1$, $CSLA_2$, and $CSLB_2$, ... which are each delayed by a predetermined time behind the preceding signal.

Figure 23A:
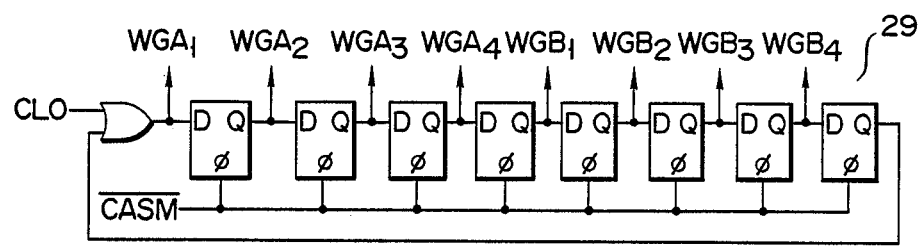
FIG. 23A shows a circuit diagram of a generating circuit for generating control signals for write control gates of FIG. 16.
Figure 24:
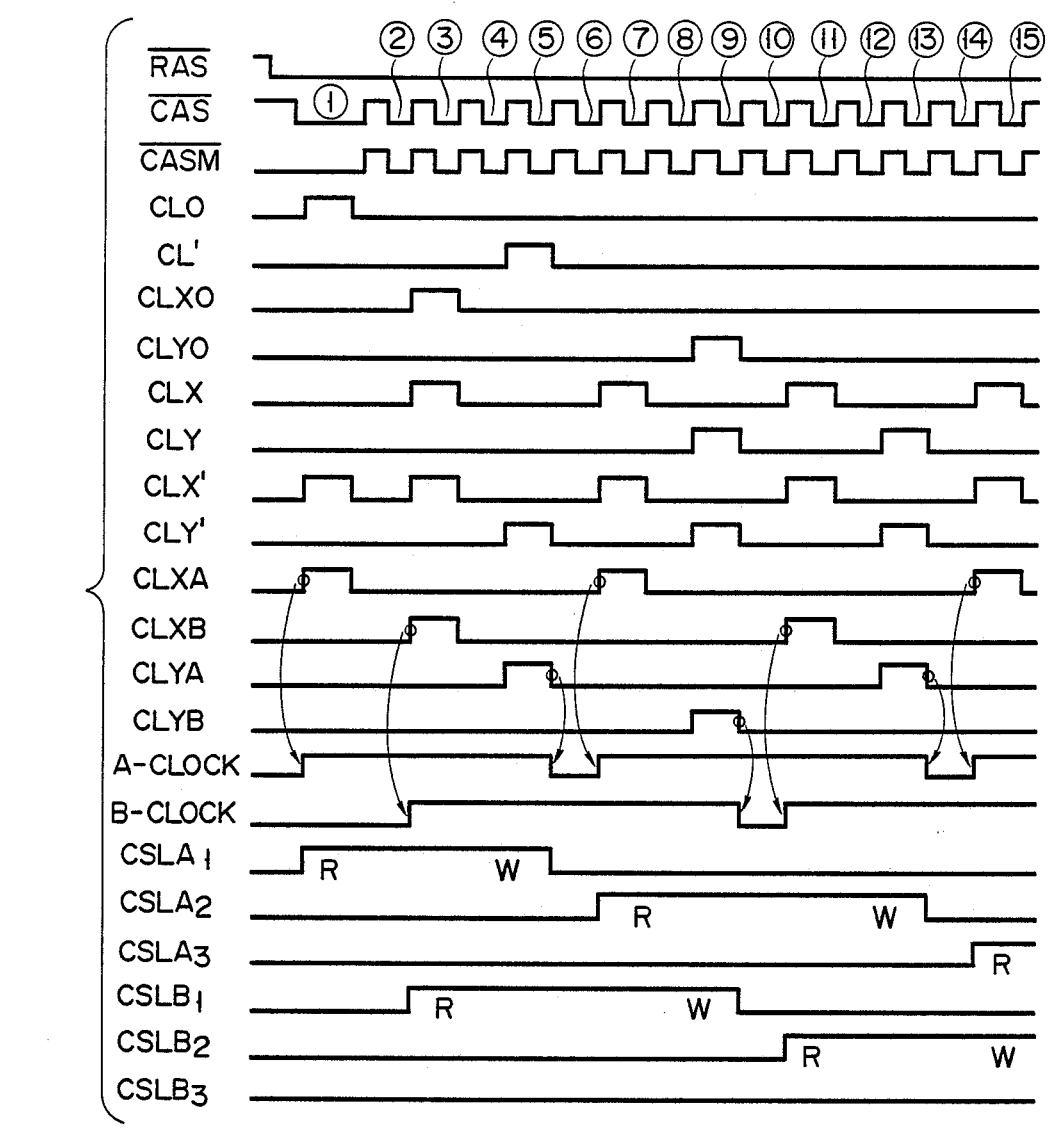
FIG. 24 shows a waveform diagram illustrating waveforms of various control signals of the second embodiment (FIG. 16)

Drive signals WGAj and WGBj (j=1 to 4) for write control gates $10_1$ and $10_2$ in FIG. 16 are generated by D type FF group 29, as shown in FIG. 23A. Clock CLO (FIG. 11A) is input to FF group 29 made of eight FFs. The sum of the output of the 8th FF and clock CLO is write control signal WGA1. The output of the second FF is write control signal WGA2. Similarly, write control signals WGA3, WGA4, WGB1, ... WGB4 are obtained.

Figure 23B:
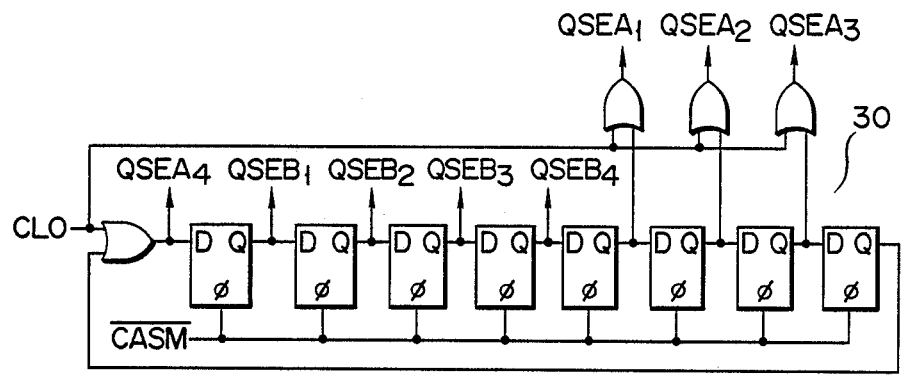
FIG. 23B shows a circuit diagram of a generating circuit for generating control signals for read control gates and activate signal for output data sense amplifiers of FIG. 16.

Activate signals QSEAj and QSEBj (j=1 to 4) to be supplied to read control gates $6_1$ and $6_2$ (FIG. 16) and output data amplifiers $5_1$ and $5_2$ are generated by using the group of eight FFs. FIG. 23B shows how QSEA1 to QSEA4 and QSEB1 to QSEB4 are taken out, and therefore, further description will be omitted.

Figure 26:
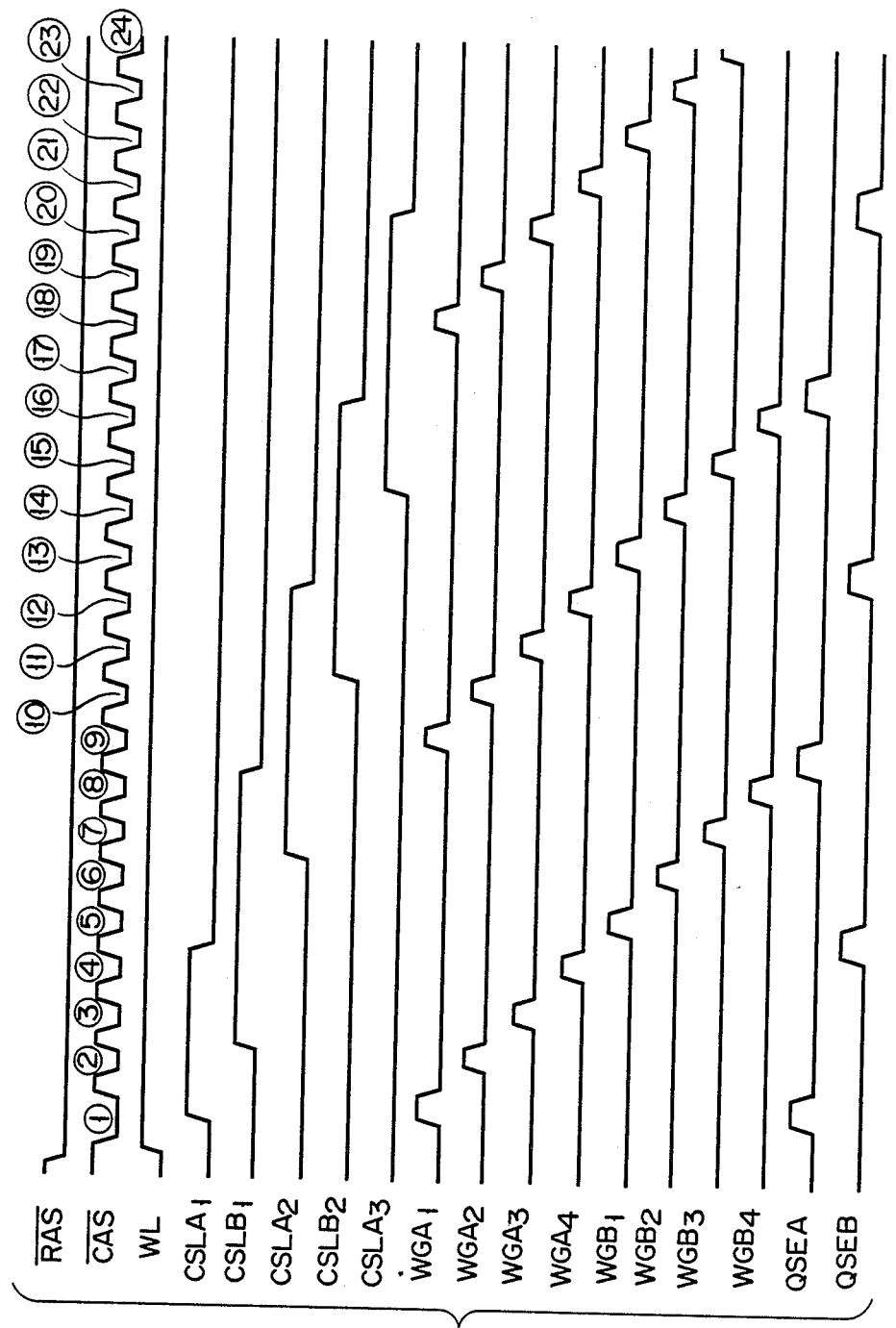
FIGS. 26 and 27 show operation timing diagrams of the third embodiment of FIG. 25.
Figure 27:
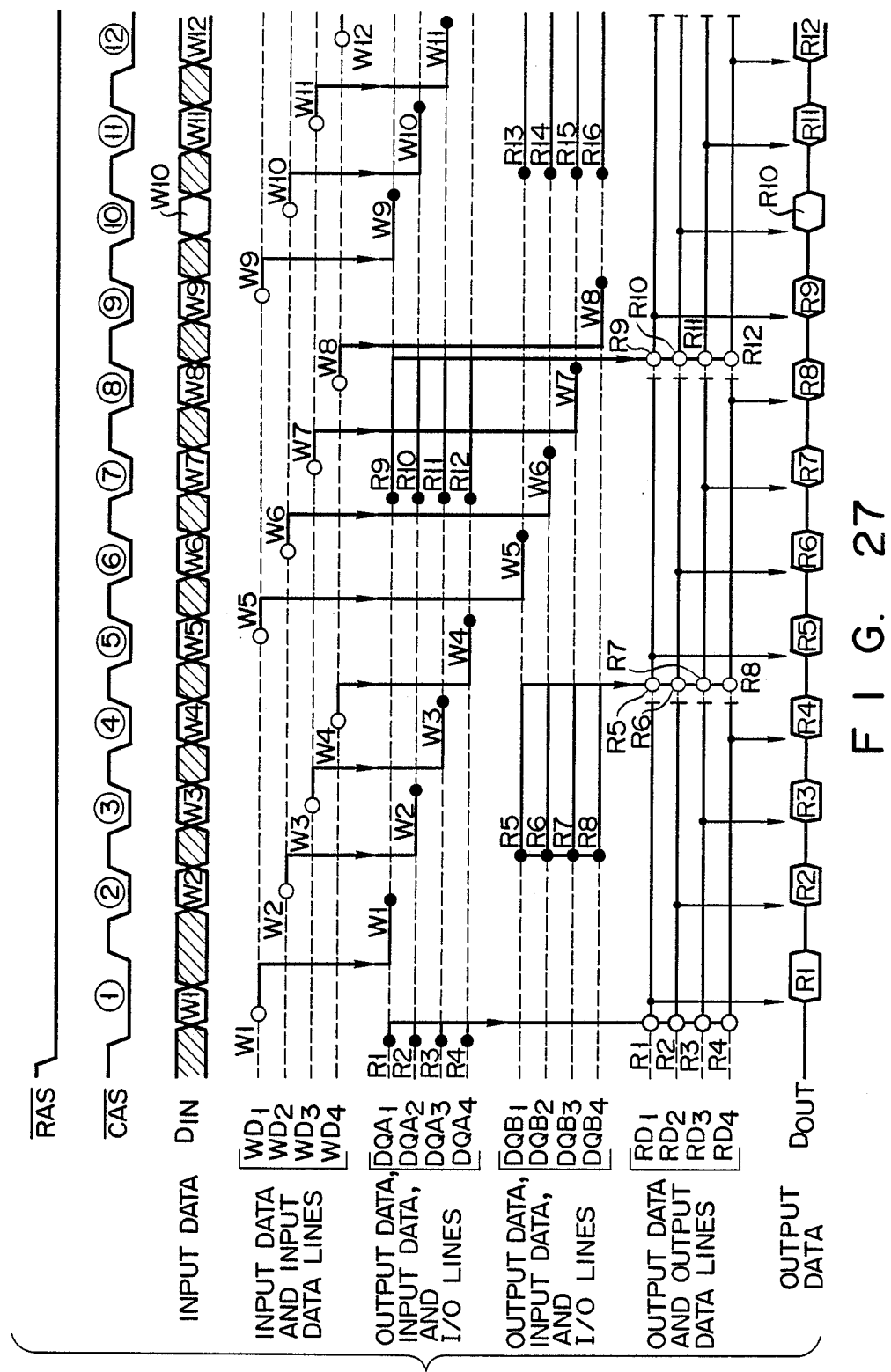
Figure 28:
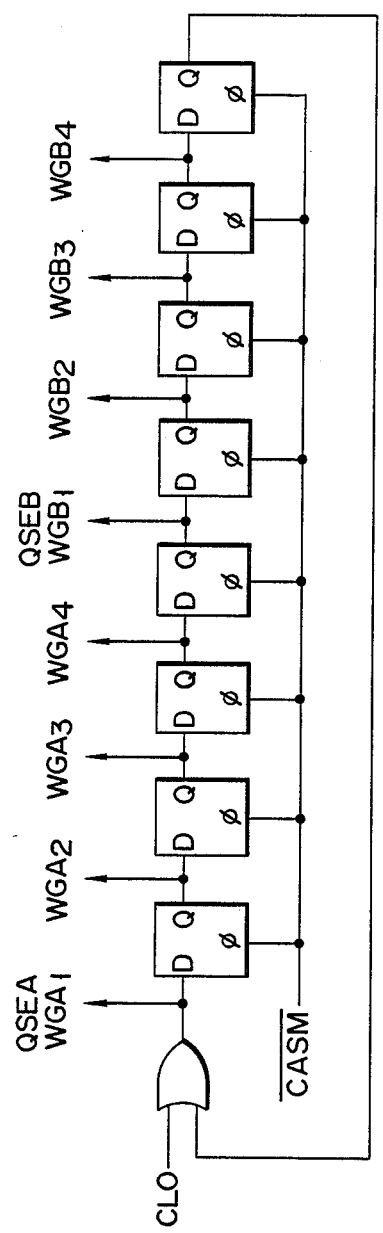
FIG. 28 shows a circuit diagram of a generating circuit for generating control signals for write control gates, control signals for read control gates, and activate signals for the output data sense amplifier of FIG. 25.

FIG. 25 shows a wiring diagram of a third embodiment of this invention. The third embodiment differs from the second embodiment of FIG. 16 in the following respect. In the third embodiment, output data amplifiers $5_1$ and $5_2$ respectively connected to I/O lines $3_1$ and $3_2$ are activated 4 bits in parallel and read control gates $6_1$, $6_2$ are controlled 4 bits in parallel. In other words, activate signals QSEA and QSEB are respectively supplied to first and second memory banks $1_1$ and $1_2$. FIGS. 26 and 27 show operation timing diagrams of the third embodiment. The basic operation of the third embodiment is the same as that of the second embodiment (FIG. 16). Therefore, the detailed description will be omitted. The configuration of the circuits for generating various types of signals including column select signals $CSLA_1, CSLA_2, \ldots, CSLB_1$, and $CSLB_2$ is also the same as that of the second embodiment. Activate signals QSEA and QSEB can be generated by a circuit simpler than that in the second embodiment. In the second embodiment, activate signals QSEA and QSEB and control signals WGA and WGB for write control gates $10_1$ and $10_2$ are generated by different FF groups, as shown in FIGS. 23A and 23B. In the third embodiment, the FF group for generating write control signals WGA and WGB may be used as a generating circuit for generating activate signals QSEA and QSEB, as shown in FIG. 28.

In the second embodiment of FIG. 16 and the third embodiment of FIG. 25, the shift register has the length of 4 bits, and the data read and write operations are executed 4 bits for one time operation, as in the first embodiment. However, the extended nibble mode operation may use 8 bits or 16 bits for the data unit of one time operation. In the second and third embodiments of FIGS. 16 and 25, the extended nibble mode operation having a large timing margin may be realized, because both embodiments include the I/O lines respectively dedicated to the first and second memory banks. Furthermore, in the second embodiment of FIG. 16, the extended nibble mode operation can be changed bit by bit since write control gates $10_1$ and $10_2$ arranged in parallel are controlled at staggered timings. This means that the input data to be serially accessed can be changed bit by bit, and this is fairly convenient for the user.

In the first embodiment, for example, the activation timings of bit line sense amplifiers $2_1$ and $2_2$ are not referred to. Noises induced into the power supply line Vcc (not shown) and the ground line Vss (not shown) can be suppressed if different activation timings are used for bit line sense amplifier $2_1$ and $2_2$. A fourth embodiment having a noise suppression means for suppressing the noises will be described, referring to FIGS. 30 to 33.

Figure 29:
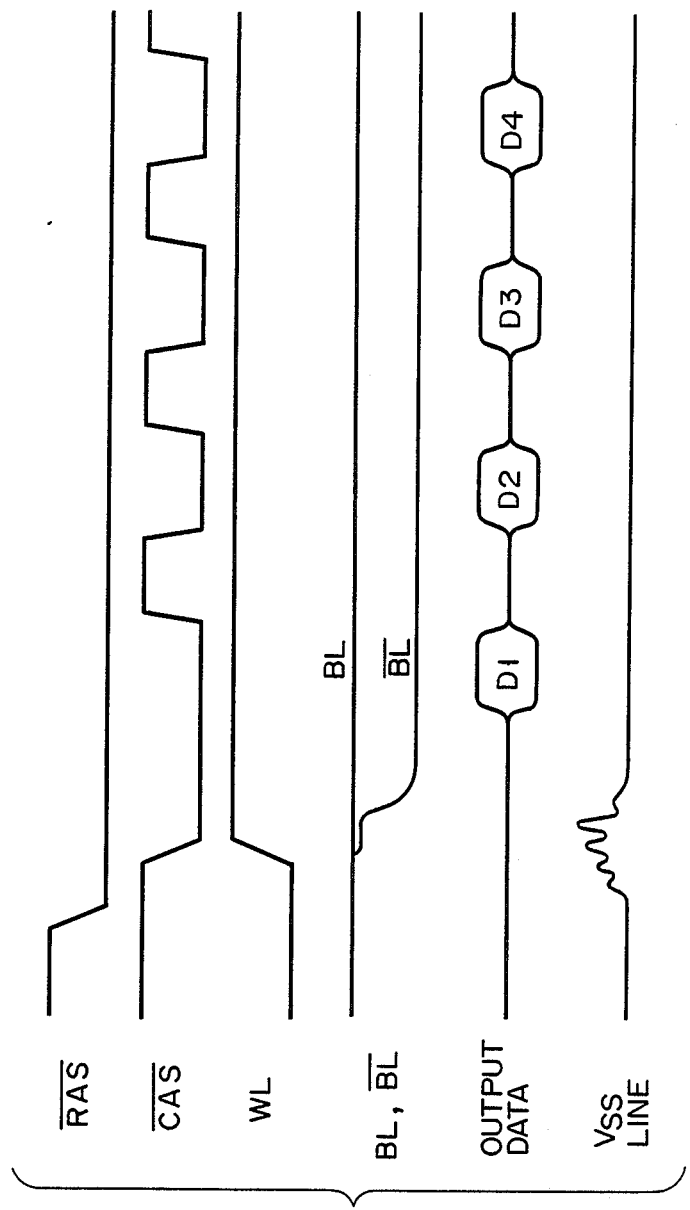
FIG. 29 shows an operation timing diagram of a prior dRAM.

FIG. 29 shows a timing diagram of the nibble mode operation of the prior dRAM. In the prior nibble mode operation, as shown in FIG. 29, $\overline{RAS}$ clock (row address strobe signal) goes from "1" (H) to "0l" (L), and memory cells are activated, and then $\overline{CAS}$ clock (column address strobe signal) goes from "H" to "L", and one word line is selected. Subsequently, the cycle (toggle), which is already described in the first embodiment, is repeated. That is, in the cycle, the $\overline{CAS}$ clock is reset and rendered "L" again while the $\overline{RAS}$ clock is kept at "L". In this way, column addresses are successively accessed.

In the nibble mode, the noise coming from the dRAM due to the power source, is produced in either of the following two situations: (1) When $\overline{RAS}$ clock changes its logical state from "H" to "L" to generate a train of activate signals, and the circuit are activated by the activate signals; and (2) when the circuit current abruptly changes at the time of precharging the bit lines. To be more specific, if current abruptly changes at di/dt in the circuits, the transient voltage expressed by Ldi/dt is induced in the circuits. The inductance L exists in the lines at Vcc (power potential), Vss line at ground potential, lead wires, bonding wires, and wirings of the memory chip. As the memory capacity of the dRAM is larger, the L components are larger. The result is a lowering of the Vcc potential and/or a rising of the Vss potential. FIG. 29 illustrates a situation that when the $\overline{RAS}$ clock falls and then the $\overline{CAS}$ clock falls, to select a word line WL, and to activate bit lines BL and $\overline{BL}$, the potential of the Vss line rises. Such noise may cause an erroneous operation of the circuit. It is assumed that in the input section, the Vss potential rises by 1 to 2V. In this case, even if the input potential is at TTL level of 2.4 or more and is in "H" level, this "H" level is treated as "L" level. Also, in the output section, although the output should be in "L" level, it is detected as "H" level if the Vss potential rises as shown in FIG. 29. The same erroneous operation may occur when the Vcc potential lowers due to the noise. Such dRAM noise increases with increase of bits of dRAM, as from 1M bits to 4M bits.

The noise suppressing method as mentioned above is based on the idea to minimize the rate di/dt of the abrupt change of current. This approach, however, is contradictory to the demand for high speed operation of dRAMs.

To cope with this problem, the dRAM of a fourth embodiment of this invention has the following circuit configuration. In this embodiment, a plurality of memory cells, which are selected by the same row address, are arranged into first and second memory banks $1_1$ and $1_2$, so as to allow the continuous execution of the nibble mode operation. The activate timing for the bit line sense amplifiers coupled with the second memory bank $1_2$ is staggered with respect to that of the bit line sense amplifiers coupled with the first memory bank $1_1$, to thereby reduce the di/dt value. Alternatively, the activate timings of the word lines coupled with the first and second memory banks may be staggered.

Figure 30:
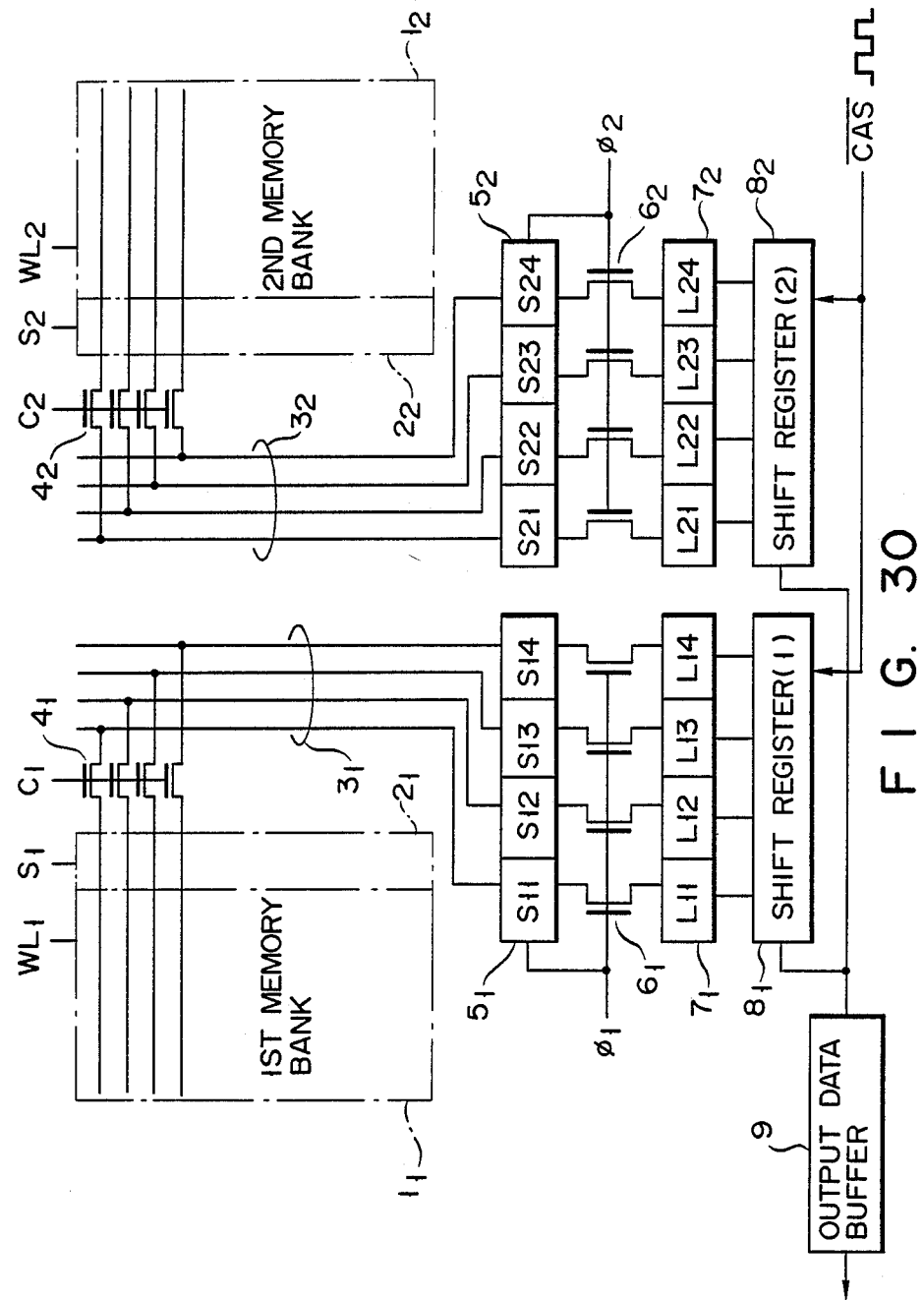
FIG. 30 shows a wiring diagram of a fourth embodiment of the dRAM according to this invention.

In FIG. 30, word lines WL1 and WL2 are selected by the same row address. The first and second memory banks $1_1$ and $1_2$, bit line sense amplifiers $2_1$ and $2_2$, transfer gates or column select gates $4_1$ and $4_2$ and I/O lines $3_1$ and $3_2$ have already been described referring to FIG. 11. The memory cells of four bits, which are arranged in first memory bank $1_1$ and connected to word line $WL_1$, are connected to I/O line $3_1$, via bit line sense amplifiers $2_1$ and transfer gates $4_1$. The memory cells of four bits, which are arranged in second memory bank $1_2$ and connected to word line $WL_2$, are connected to I/O line $3_2$, via bit line sense amplifiers $2_2$ and transfer gates $4_2$. $S_1$ and $S_2$ designate activate signal lines for bit line sense amplifiers $2_1$ and $2_2$. $C_1$ and $C_2$ indicate control signal lines for transfer gates $4_1$ and $4_2$. The 4-bit data read out into I/O lines $3_1$ and $3_2$ are amplified by sense amplifiers $5_1$ and $5_2$, and latched in latch circuits $7_1$ and $7_2$, via read control gates $6_1$ and $6_2$. The latched data are read out and transferred to shift registers $8_1$ and $8_2$. These shift registers convert the parallel data into serial data. Finally, the serial data is output from output data buffer 9. Control and activate signals $\phi_1$ and $\phi_2$ control read control gates 61 and 62, and activate sense amplifiers $5_1$ and $5_2$.

Figure 33:
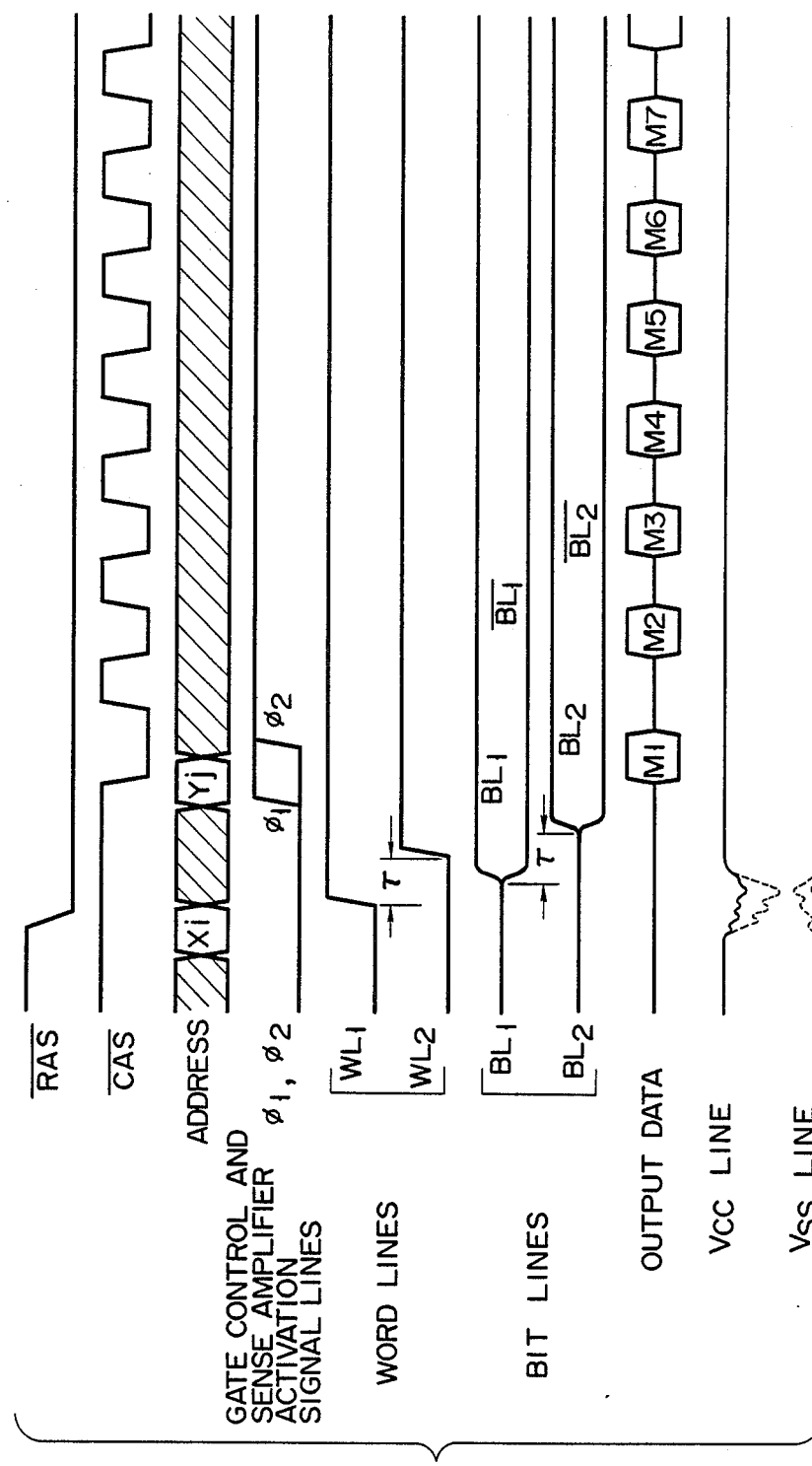
FIG. 33 shows an operation timing diagram of the dRAM in FIG. 30.

In the fourth embodiment, the select timing for word line $WL_2$ is delayed by $\tau$ behind the select timing for word line $WL_2$ (FIG. 33). The select timing for the activate control signal lines $S_2$ is delayed by $\tau$ behind that for activate control signal line $S_1$. The level relation between the bit lines $BL_1$ and $BL_2$ of the first and second memory bank is as shown in FIG. 33.

FIG. 31 shows a circuit for generating drive signals for driving the control lines. $\overline{RAS}$ and $\overline{CAS}$ clocks are input to the delay circuit containing series-connected CMOS inverters. Row and column address signals $A_R$ and $A_C$ are decoded by row and column decoders 35 and 37. Word and column line select circuits 36 and 38 select one word line and one column, respectively. Delay select circuits $40_1$ to $40_4$ are for forming staggered control signals for use in first and second memory banks.

Figure 32:
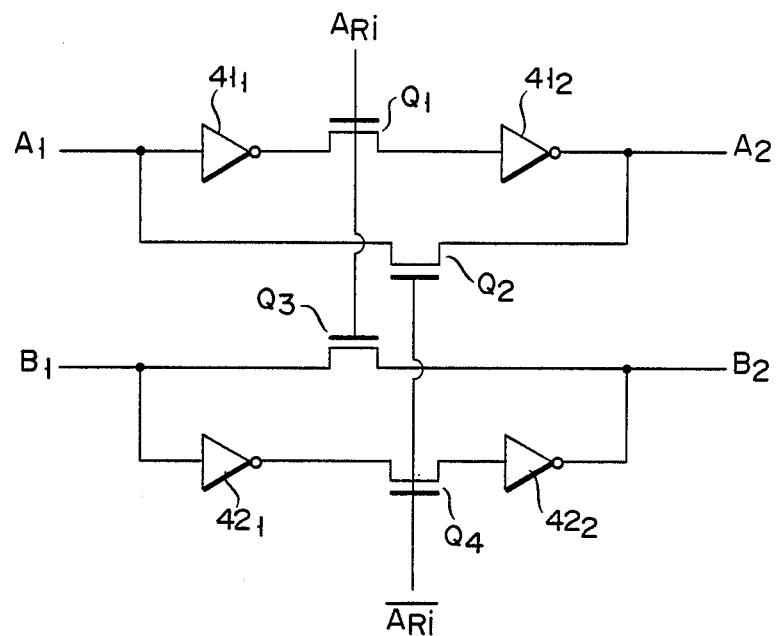
FIG. 32 shows in details a circuit diagram of delay select circuits of FIG. 31.

Delay select circuits $40_1$ to $40_4$ are configured as shown in FIG. 32. A series circuit contains inverters $41_1$ and $41_2$ (elements used for signal delay) and transfer gates $Q_1$, and produces output signal $A_2$ in response to input signal $A_1$. Transfer gate $Q_2$ is coupled across the series circuit. Another series circuit contains inverters $42_1$, and $42_2$, and transfer gate $Q_4$, and receives input signal $B_1$ and produces output signal $B_2$. Transfer gate $Q_3$ is coupled across this series circuit. Transfer gate pairs $Q_1$ and $Q_3$, and $Q_2$ and $Q_4$ are controlled by address signals ARi and $\overline{ARi}$, respectively. When address signals ARi and $\overline{ARi}$ are in "H" level, and "L" level, no delay is present between signals $B_1$ and $B_2$, and a fixed delay is present between signals $A_1$ and $A_2$. When address signals ARi and $\overline{ARi}$ are in "L" level, and "H" level, no delay is present between signals $A_1$ and $A_2$, and a fixed delay is present between signals $B_1$ and $B_2$.

The operation of the FIG. 30 embodiment will be described referring to FIG. 33. In this embodiment, the bit lines are precharged to the potential of $\frac{1}{2}$ Vcc. When $\overline{RAS}$ clock goes low (L), row decoder 35 selects the row address, and the potential of a given word line rises. The potential of the word line $WL_1$ of memory bank $1_1$ rises with no delay. The potential of the word line $WL_2$ of second memory bank $1_2$ rises, delayed a predetermined time $\tau$, e.g. 10 ns, after the potential rise of the word lien $WL_1$. The bit line sense amplifiers are not activated till the data is read out from the memory cells into the bit lines. Upon activation of these amplifiers, the bit lines are rendered "1" or "0l" according to the read out data. In this embodiment, delay time $\tau$ is used between the select timings for activation control signal lines $S_1$ and $S_2$ connected to sense amplifiers $2_1$ and $2_2$. The embodiment thus arranged can realize the extended nibble mode operation. Specifically, the data are read out in parallel alternatively from first and second memory banks, into I/O lines $3_1$ and $3_2$. In this case, the data is read out 4 bits for one time. The read out data is loaded into latch circuits $7_1$ and $7_2$, via sense amplifiers $5_1$ and $5_2$. The shift registers $8_1$ ad $8_2$ converts the data from parallel to serial. The serial data is taken out from buffer 9. The sequence of operation is repeated. The data can be read out from all the memory cells belonging to one word line, as a matter of course. Following the read-out of data from the memory cells of one word line, the data may be read out of the memory cells of another word line. In this way, the data can be read out of all the memory cells in the entire memory array. This is true for the data written. With a time difference of about 10 ns between the activate timings for the first and second memory banks, the noise appears in the second memory bank after the noise disappears in the first memory bank. This reduces the peak value of the noise to half that in the prior art.

In the above instance, the time difference is given between the rise timings of the potential in the word lines $WL_1$ and $WL_2$ as selected by the same row address. Alternatively, it may be given between the active timings for the sense amplifiers $2_1$ and $2_2$.

What is claimed is:

1. A semiconductor memory system with dynamic random access memory cells which are integrated in a semiconductor substrate, comprising:

first and second memory banks, a plurality of said memory cells connected to a word line being arranged in each of said memory banks;

read/write means for reading output data and writing input data from and into said memory cells, in which, while output data from said memory cells of said first memory bank latched in output data latching circuits are subsequently read out in synchronism with a column address store signal, output data from said memory cells of said second memory bank are transmitted to input/output lines and input data to be written into said memory cells of said first memory bank are latched subsequently in input data latching circuits in synchronism with said column address strobe signal, and in which, while output data from said memory cells of said second memory bank latched in said output data latching circuits are subsequently read out in synchronism with said column address strobe signal, output data from said memory cells of said first memory bank are transmitted to said input/output lines and input data to be written into said memory cells of said second memory bank are latched subsequently in said input data latching circuits in synchronism with said column address strobe signal, said read/write operations for said first and second memory banks being repeated alternatively.

2. A semiconductor memory system according to claim 1, wherein said read/write means comprises;
- first column-selection gate means provided between said memory cells of said first memory bank and said input/output lines for selecting said memory cells of said first memory bank;
- second column-selection gate means provided between said memory cells of said second memory bank and said input/output lines for selecting said memory cells of said second memory bank;
- output data reading gate means provided between said input/output lines and said output data latching circuits for reading output data from said memory cells of said first and second memory banks, alternatively;
- an output data shift register provided between said output data latching circuits and an output data buffer circuit for converting parallel data from said output data latching circuits into serial data and sending said serial data to said output data buffer circuit;
- input data writing gate means provided between said input/output lines and input data latching circuits for writing input data into said memory cells of said first and second memory banks; and
- an input data shift register provided between said input data latching circuits and an input data buffer circuit for converting serial data from said input data buffer circuit into parallel data to be latched in said input data latching circuits.

3. A semiconductor memory system according to claim 2, wherein there are provided a first group of bit line sense amplifiers between memory cells of said first memory bank and said first column-selection gate means and a second group of bit line sense amplifiers between memory cells of said second memory bank and said second-column-selection gate means, said first group of bit line sense amplifiers and said second group of bit line sense amplifiers being activated in different timings for suppressing noises produced on a power voltage supply line and a ground voltage line.

4. A semiconductor memory system according to claim 1, wherein said read/write means comprises;
- first input/output lines for said memory cells of said first memory bank;
- second input/output lines for said memory cells of said second memory bank;
- first column-selection gate means provided between said memory cells of said first memory bank and said first input/output lines for selecting said memory cells of said first memory bank;
- second column-selection gate means provided between memory cells of said second memory bank and said second input/output lines for selecting said memory cells of said second memory bank;
- first output-data-reading gate means provided between said first input/output lines and output data latching circuits for reading output data from memory cells of said first memory bank;
- second output-data-reading gate means provided between said second input/output lines and output data latching circuits for reading output data from memory cells of said second memory bank;
- an output data shift register provided between output data latching circuits and an output data buffer circuit for converting parallel data from said output data latching circuits into serial data and sending said serial data to said output data buffer circuit;
- first input-data-writing gate means provided between said first input/output lines and input data latching circuits for writing said input data into said memory cells of said first memory bank;
- second input-data-writing gate means provided between said second input/output lines and said input data latching circuits for writing said input data into said memory cells of said second memory bank; and
- an input data shift register provided between said input data latching circuits and an input data buffer circuit for converting serial data from said input data buffer circuit into parallel data to be latched in said input data, latching circuits.

5. A semiconductor memory system according to claim 4, wherein each of said first output-data-reading gate means, second output-data-reading gate means, said first input-data-writing gate means, and said second input-data-writing gate means comprises four gates, said four gates are subsequently controlled in different timings in synchronism with toggles of said column address strobe signal.

6. A semiconductor memory system according to claim 4, wherein each of said first input-data-writing gate means and said second input-data-writing gate means comprises four gates, said four gates are subsequently controlled in different timings in synchronism with toggles of said column address strobe signal, and that said first output-data-reading gate means comprises four gates controlled by a first signal at the same time and said second output-data-reading gate means comprises four gates controlled by a second signal at the same time.

7. A semiconductor memory system according to claim 4, wherein there are provided a first group of bit line sense amplifiers between memory cells of said first memory bank and said first column-selection gate means and a second group of bit line sense amplifiers between memory cells of said second memory bank and said second-column-selection gate means, said first group of bit line sense amplifiers and said second group of bit line sense amplifiers being activated in different timings for suppressing noises produced on a power voltage supply line and a ground voltage line.

8. A semiconductor memory system with dynamic random access memory cells which are integrated in a semiconductor substrate, comprising:
- first and second memory banks, in said first memory bank being arranged a first group of memory cells connected to a word line and in said second memory bank being arranged a second group of memory cells connected to said word line;
- first column-selection gate means provided between said memory cells of said first memory bank and input/output lines for selecting said memory cells of said first memory bank;
- second column-selection gate means provided between said memory cells of said second memory bank and said input/output lines for selecting memory cells of said second memory bank;
- output-data-reading gate means provided between said input/output lines and output data latching circuit for reading out data from said memory cells of said first and second memory banks, alternatively;

an output data shift register provided between said output data latching circuits and an output data buffer circuit for converting parallel data from said output data latching circuits into serial data and sending said serial data to said output data buffer circuits;

input-data-writing gate means provided between said input/output lines and input data latching circuits for writing input data into said memory cells of said first and second memory banks; and an input data shift register provided between said input data latching circuits and an input data buffer circuit for converting serial data from said input data buffer circuit into parallel data, wherein each block of n bits of said first group memory cells and each block of n bits of said second group memory cells are alternatively read from and written in said first and second group memory cells in such a way that each bit is read and written continuously in synchronism with the toggles of a column address strobe signal through said input/output lines.

9. A semiconductor system according to claim 8, wherein said n denotes 4.

10. A semiconductor memory system with dynamic random access memory cells which are integrated in a semiconductor substrate, comprising:

first and second memory banks, in said first memory bank being arranged a first group of memory cells connected to a word line and in said second memory bank being arranged a second group of memory cells connected to said word line;

first input/output lines for said memory cells of said first memory bank;

second input/output lines for said memory cells of said second memory bank;

first column-selection gate means provided between said memory cells of said first memory bank and said first input/output lines for selecting said memory cells of said first memory bank;

second column-selection gate means provided between memory cells of said second memory bank and said second input/output lines for selecting said memory cells of said second memory bank;

first output-data-reading gate means provided between said first input/output lines and output data latching circuits for reading output data from said memory cells of said first memory bank;

second output-data-reading gate means provided between said second input/output lines and said output data latching circuits for reading output data from memory cells of said second memory bank;

an output data shift register provided between said output data latching circuits and an output data buffer circuit for converting parallel data from said output data latching circuit into serial data and sending said serial data to said output data buffer circuit;

first input-data-writing gate means provided between said first input/output lines and input-data-latching circuits for writing said input data to said memory cells of said first memory bank;

second input-data-writing gate means provided between said second input/output lines and said input data latching circuits for writing said input data into said memory cells of said second memory bank; and an input data shift register provided between said input data latching circuit and an input data buffer circuit for converting serial data from said input data buffer circuit into parallel data to be latched in said input data latching circuits;

wherein each block of n bits of said first group memory cells and each block of n bits of said second group memory cells are alternatively read from and written in said first and second group memory cells in such a way that each bit is read and written continuously in synchronism with the toggles of a column address strobe signal through said first and second input/output lines.

11. A semiconductor system according to claim 10, wherein said n denotes 4.

* * * * *